US006882016B2

(12) United States Patent
Takenaka

(10) Patent No.: US 6,882,016 B2
(45) Date of Patent: Apr. 19, 2005

(54) SEMICONDUCTOR DEVICE, ELECTRO-OPTICAL DEVICE, ELECTRONIC APPARATUS, AND METHOD FOR MANUFACTURING SEMICONDUCTOR DEVICE

(75) Inventor: Satoshi Takenaka, Ryuo-cyo (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/663,902

(22) Filed: Sep. 17, 2003

(65) Prior Publication Data

US 2004/0113214 A1 Jun. 17, 2004

(30) Foreign Application Priority Data

| Sep. 20, 2002 | (JP) | 2002-275199 |
| Sep. 20, 2002 | (JP) | 2002-275200 |
| Jul. 11, 2003 | (JP) | 2003-196115 |

(51) Int. Cl.$^7$ ............................................. H01L 29/72
(52) U.S. Cl. .................... 257/411; 257/410; 257/413; 257/414
(58) Field of Search .................... 257/410, 411, 257/413, 414

(56) References Cited

U.S. PATENT DOCUMENTS 5,314,834 A * 5/1994 Mazure et al. ............... 438/301

2003/0025444 A1 * 2/2003 Seo et al. ..................... 313/499

FOREIGN PATENT DOCUMENTS

| JP | A 6-120249 | 4/1994 |
| JP | A 7-142735 | 6/1995 |

OTHER PUBLICATIONS

Yazaki et al., "Conduction Mechanism of Leakage Current Observed in Metal–Oxide–Semiconductor Transistors and Poly–Si Thin–Film Transistors", Jpn. J. Appl. Phys., vol. 31 (1992), pp 206–209, Jan.

* cited by examiner

Primary Examiner—Edward Wojciechowicz
(74) Attorney, Agent, or Firm—Oliff & Berridge, PLC

(57) ABSTRACT

A semiconductor device is provided including a transistor having excellent ON current characteristics and OFF leakage current characteristics, an electro-optical device holding an electro-optical material using the semiconductor device, an electronic apparatus using the electro-optical device, and a method for manufacturing the semiconductor device. For a transistor, a source region and a drain region are impurity regions heavily doped by a self-aligned method relative to a gate electrode. Parts of the gate insulating film overlapping with boundary regions of the channel formation region adjacent to the drain region and the source region, are thicker than a part of the gate insulating film overlapping with a center part of the channel formation region, relative to the longitudinal direction of the channel.

11 Claims, 20 Drawing Sheets

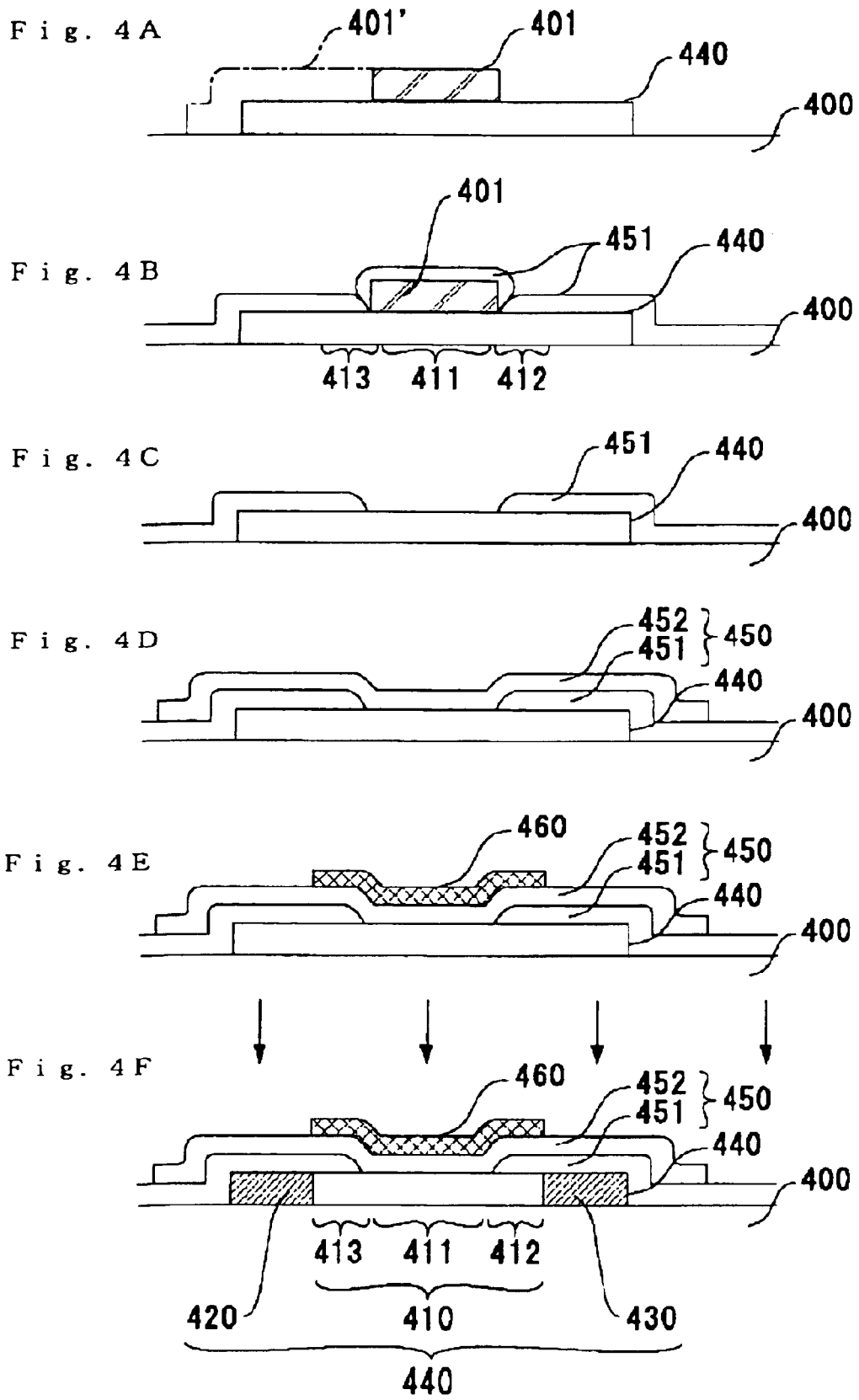

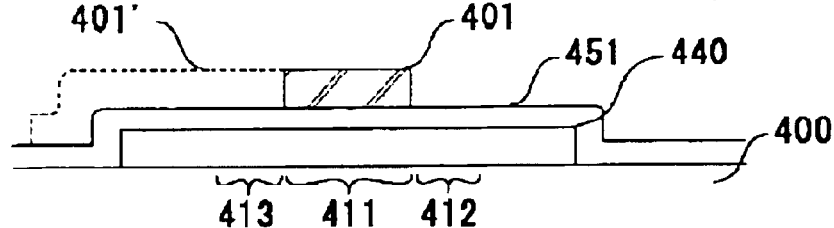
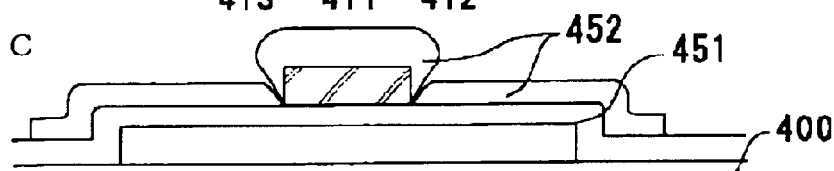
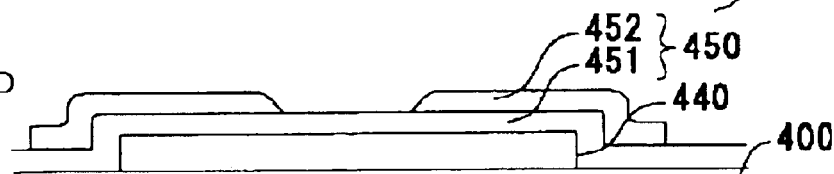
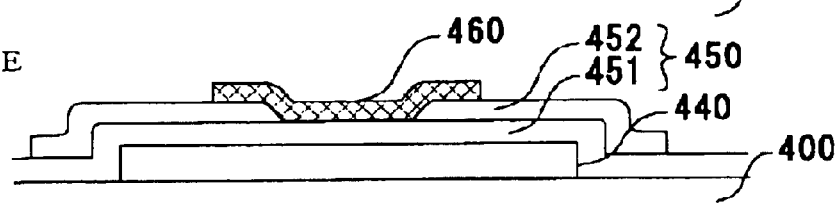
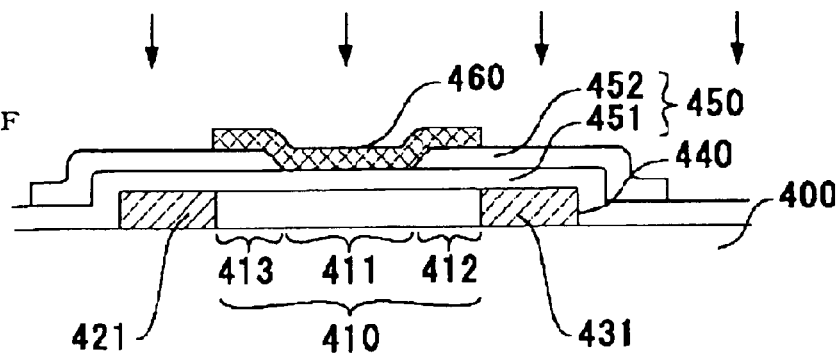
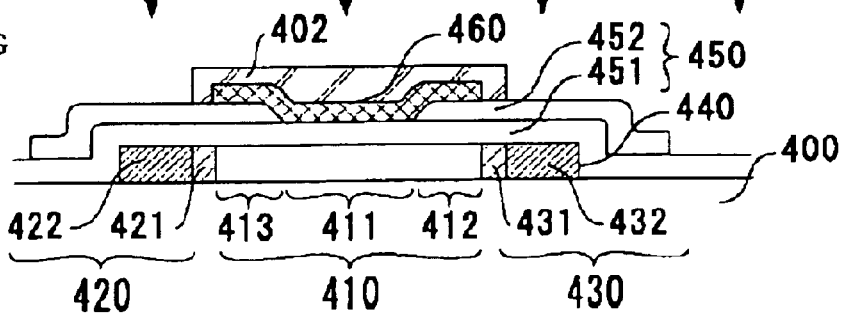

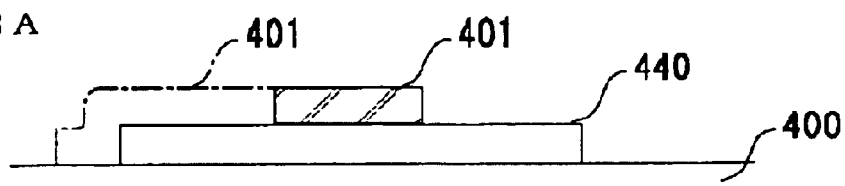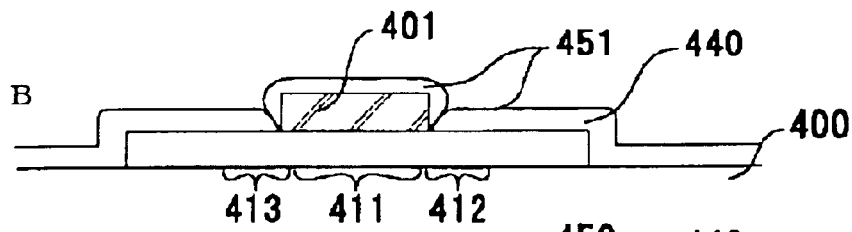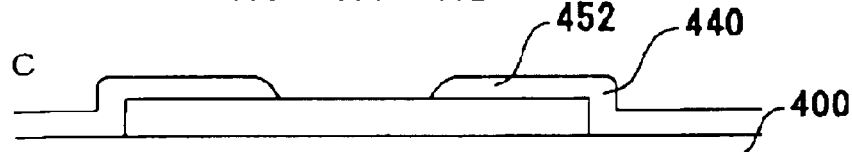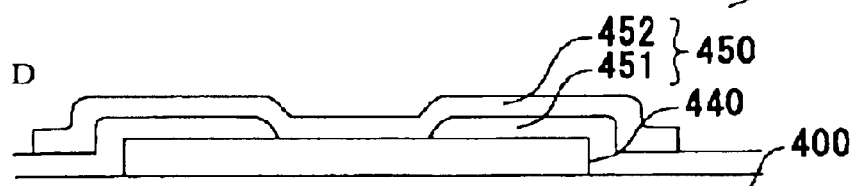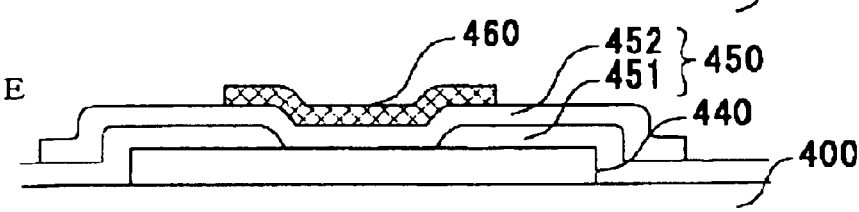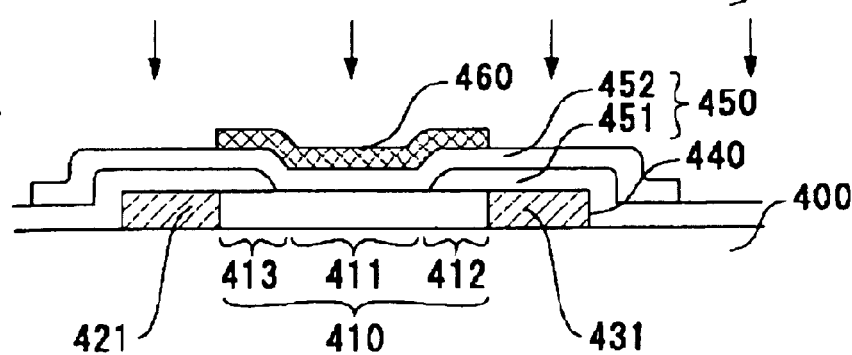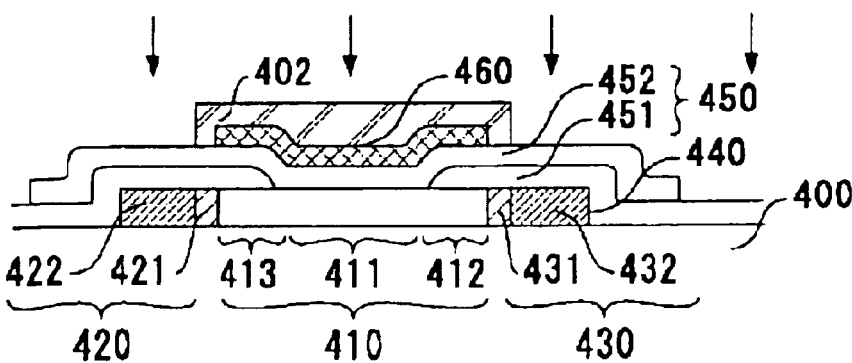

IMAGE DISPLAY REGION 10a

SEMICONDUCTOR DEVICE, ELECTRO-OPTICAL DEVICE, ELECTRONIC APPARATUS, AND METHOD FOR MANUFACTURING SEMICONDUCTOR DEVICE

BACKGROUND OF THE INVENTION

1. Field of Invention

The present invention relates to a semiconductor device in which an electric field effect type transistor, such as MIS (Metal-Insulator-Semiconductor) type transistor or an MOS (Metal-Oxide-Semiconductor) type transistor, is formed on a substrate, an electro-optical device holding an electro-optical material using such a semiconductor device, an electronic apparatus using such an electro-optical device, and to a method for manufacturing the semiconductor device.

2. Description of Related Art

In an electro-optical device, such as an active-matrix-type liquid crystal device or an organic electroluminescent display device, a substrate on which a plurality of thin film transistors (electric field effect transistors, hereinafter referred to as TFTs [Thin Film Transistors]) are formed as active elements for switching pixels, is used.

There are two possible related art structures of the TFT formed on such a substrate: a self-aligned structure shown in FIG. 21(A) and an LDD structure shown in FIG. 21(B).

In the self-aligned-structure TFT, parts of a source region 420 and a drain region 430 facing both ends of a gate electrode 460, with a gate insulating film 450 interposed therebetween, are heavily doped as shown in FIG. 21(A). As a result, there is an advantage that the level of ON current is high as shown with a dotted line L2 in FIGS. 2 and 6.

However, in the self-aligned-structure TFT, since the electric field in one end of the drain is intense, there are problems that the level of OFF leakage current is high and the current level increases steeply as shown with a dotted line L2 in FIGS. 2 and 6.

In contrast to the self-aligned-structure TFT, in the LDD-structure TFT shown in FIG. 21(B), a source region 420 and a drain region 430, facing both ends of a gate electrode 460 with a gate insulating film 450 interposed therebetween, contain a lightly doped source region 421 and a lightly doped drain region 431, respectively. Thus, in the LDD-structure TFT, since the electric field in one end of the drain declines, the level of OFF leakage current is low, and the sudden rise of current level is reduced or prevented, as shown with a one-dot-chain line L3 in FIGS. 2 and 6 (See M. Yazaki, S. Takenaka and H. Ohshima: Jpn. J. Appl. Phys. vol. 31 (1992) Pt. 1, No 2A pp. 206–209).

However, in the LDD-structure TFT, since the lightly doped regions are interposed between the source region 420 and the drain region 430, there is a problem that the level of ON current is low, as shown with a one-dot-chain line L3 in FIGS. 2 and 6. Furthermore, in the LDD-structure TFT, if the dimensions of the lightly doped source region 421 and the lightly doped drain region 431 are lengthened in order to further decrease the OFF leakage current, there is a problem that the ON current is markedly reduced.

As described above, in related art structures, there is a problem that an improvement of one characteristic results in a detriment to another characteristic because of a trade-off relationship between the properties of ON current and OFF leakage current.

SUMMARY OF THE INVENTION

In view of these problems, the present invention provides a semiconductor device including a transistor having excellent characteristics of both ON current and OFF leakage current, an electro-optical device holding an electro-optical material using the semiconductor device, an electronic apparatus using the electro-optical device, and a method for manufacturing the semiconductor device.

To address the aforementioned problems, according to the present invention, there is provided a semiconductor device in which transistors are formed on a substrate, each of the transistors including a channel formation region to form a channel between a source region and a drain region, and a gate electrode facing the channel formation region with a gate insulating film interposed therebetween, at least a part of the gate insulating film overlapping with a boundary region of the channel formation region adjacent to the drain region, being thicker than a part of the gate insulating film overlapping with a center part of the channel formation region, relative to the longitudinal direction of the channel.

In the present specification, the term, "MIS type" or "MOS type" is not limited to a gate electrode made of metal, and also includes a gate electrode made of a conductive semiconductor.

In the transistor, according to the present invention, the intensity of the electric field in one end of the drain declines because a gate insulating film facing one end of the drain is thick. As a result, the level of OFF leakage current is low, and the sudden rise of current level is prevented. Furthermore, in a center part of a channel formation region, the level of ON current is high because of a thin gate insulating film. Thus, according to the present invention, both ON current characteristics and OFF leakage current characteristics can be enhanced.

According to the present invention, a part of the gate insulating film overlapping with a boundary region of the channel formation region adjacent to the source region, may be thicker than the part of the gate insulating film overlapping with the center part of the channel formation region, relative to the longitudinal direction of the channel.

According to the present invention, each of the source region and the drain region may have a lightly doped region or an offset region facing the gate electrode with the insulating film interposed therebetween. Such transistor structure may be called as an LDD-structure or an offset-gate-structure. In the present specification, the offset region signifies a part facing both ends of the gate electrode with the gate insulating film interposed therebetween, which is doped with the same impurity density as the channel formation region. The offset region can be formed by providing the source and drain regions to be deviated from both ends of the gate electrode relative to the longitudinal direction of the channel.

When the present invention is applied to the LDD-structure or the offset-gate-structure transistor, at least a part of the gate insulating film overlapping with the boundary region of the channel formation region adjacent to the lightly doped region or the offset region of the drain region, is thicker than the part of the gate insulating film overlapping with the center part of the channel formation region, relative to the longitudinal direction of the channel.

In a transistor, according to the present invention, since each of the source region and the drain region has a lightly doped region or an offset region facing the ends of the gate electrode with the insulating film interposed therebetween, the intensity of the electric field in one end of the drain declines, and thus the level of OFF leakage current can be low. Furthermore, since the gate insulating film in one end of the drain is thick, the intensity of the electric field in one end of the drain is more weakened. Thus, the level of OFF leakage current is low, and the steep rise of current level is prevented. Moreover, in the center part of the channel formation region, because of a thin gate insulating film, the level of ON current is high in contrast to the low level of OFF leakage current.

For the present invention, a part of the gate insulating film overlapping with the boundary region of the channel formation region adjacent to the lightly doped region or the offset region of the source region, may be thicker than the part of the gate insulating film overlapping with the center part of the channel formation region, relative to the longitudinal direction of the channel.

In the present invention, the channel formation region, the source region, and the drain region are formed in a semiconductor film formed on a surface of the substrate.

In the present invention, the substrate is a semiconductor substrate, and the channel formation region, the source region, and the drain region may be formed on the semiconductor substrate.

A semiconductor device, according to the present invention, may be used as a substrate for an electro-optical device having an electro-optical material. Furthermore, in this case, pixels, each including a pixel switching transistor and a pixel electrode, are formed on the substrate for the electro-optical device in a matrix.

In such an electro-optical device, the electro-optical material is, for example, liquid crystal held between the substrate for the electro-optical device and a counter substrate.

In addition, the electro-optical material may be an organic electroluminescent material constituting a light-emitting device on the substrate for the electro-optical device.

An electro-optical device, according to the present invention, is used as a display part of an electronic apparatus, such as a cellular phone or a mobile personal computer.

According to the present invention, there is provided a method for manufacturing a semiconductor device in which transistors are formed on a substrate, each of the transistors including a channel formation region to form a channel between a source region and a drain region, and a gate electrode facing the channel formation region with a gate insulating film interposed therebetween, the method including forming the gate insulating film, by forming a lower-layer gate insulating film; forming a resist layer on at least a part of the surface of the lower-layer gate insulating film overlapping with a center part of the channel formation region relative to the longitudinal direction of the channel, and not forming the resist layer on at least a part of the surface of the lower-layer gate insulating film overlapping with a boundary region of the channel formation region adjacent to the drain region; forming an upper-layer gate insulating film on surfaces of the lower-layer gate insulating film and the resist layer; and removing the resist layer together with the upper-layer gate insulating film formed thereon.

According to another aspect of the present invention, there is provided a method for manufacturing a semiconductor device in which transistors are formed on a substrate, each of the transistors including a channel formation region to form a channel between a source region and a drain region, and a gate electrode facing the channel formation region with a gate insulating film interposed therebetween, the method including forming the gate insulating film, by forming a resist layer on at least a part overlapping with a center part of the channel formation region relative to the longitudinal direction of the channel, and not forming the resist layer on at least a part overlapping with a boundary region of the channel formation region adjacent to the drain region; forming a lower-layer gate insulating film on the surface side of the resist layer; removing the resist layer together with the lower-layer gate insulating film formed thereon; and forming an upper-layer gate insulating film on a surface of the lower-layer gate insulating film.

According to the present invention, the resist layer may be not formed on a part overlapping with a boundary region of the channel formation region adjacent to the source region. In such a structure, a part of the gate insulating film overlapping with a boundary region of the channel formation region adjacent to the source region, is thicker than the part of the gate insulating film overlapping with the center part of the channel formation region, relative to the longitudinal direction of the channel.

According to the present invention, when a transistor has an LDD-structure or an offset-gate-structure, there is provided a method for manufacturing the same. The method includes forming the gate insulating film, by forming a lower-layer gate insulating film; forming a resist layer on at least a part of the surface of the lower-layer gate insulating film overlapping with a center part of the channel formation region relative to the longitudinal direction of the channel, and not forming the resist layer on at least a part of the surface of the lower-layer gate insulating film overlapping with a boundary region of the channel formation region adjacent to the lightly doped region or the offset region of the drain region; forming an upper-layer gate insulating film on surfaces of the lower-layer gate insulating film and the resist layer; and removing the resist layer together with the upper-layer gate insulating film formed thereon.

In still another aspect of the present invention, there is provided a method of manufacturing a semiconductor device including forming the gate insulating film, by forming a resist layer on at least a part overlapping with a center part of the channel formation region relative to the longitudinal direction of the channel, not forming the resist layer on at least a part overlapping with a boundary region of the channel formation region adjacent to the lightly doped region or the offset region of the drain region; forming a lower-layer gate insulating film on the surface side of the resist layer; removing the resist layer together with the lower-layer gate insulating film formed thereon; and forming an upper-layer gate insulating film on a surface of the lower-layer gate insulating film.

According to the present invention, the resist layer may be not formed on a part overlapping with a boundary region of the channel formation region adjacent to the lightly doped region or the offset region of the source region. In such a structure, a part of the gate insulating film overlapping with a boundary region of the channel formation region adjacent to the lightly doped region or the offset region of the source region, is thicker than the part of the gate insulating film overlapping with the center part of the channel formation region, relative to the longitudinal direction of the channel.

BRIEF DESCRIPTION OF THE DRAWINGS

FIG. 4 is a sectional view of processes illustrating a method for manufacturing a transistor according to the third exemplary embodiment of the present invention;

FIG. 7 is a sectional view of processes illustrating a method for manufacturing a transistor according to the fifth exemplary embodiment of the present invention;

FIG. 8 is a sectional view of processes illustrating a method for manufacturing a transistor according to the seventh exemplary embodiment of the present invention;

DETAILED DESCRIPTION OF PREFERRED EMBODIMENTS

A structure and effect of a transistor unit (a semiconductor device unit) according to the first through ninth exemplary embodiments of the present invention will be described with reference to FIGS. 1–9, before explaining an example where the present invention is applied to a TFT array substrate used for an electro-optical device.

FIGS. 1(A)–1(D) are sectional views illustrating the structure of transistor units (semiconductor device units) according to the first to fourth exemplary embodiments of the present invention, respectively. FIG. 2 is a graph illustrating ON current characteristics and OFF leakage current characteristics of the transistor having a self-aligned structure according to the present invention. FIGS. 3(A–F) and 4(A–F) are sectional views of processes illustrating methods for manufacturing the transistor units according to the first and third exemplary embodiments of the present invention, respectively.

FIGS. 5(A)–5(D) are sectional views illustrating the structure of transistor units (semiconductor device units) according to the fifth to eighth exemplary embodiments of the present invention, respectively. FIG. 6 is a graph illustrating ON current characteristics and OFF leakage current characteristics of the transistor having an LDD structure according to the present invention. FIGS. 7(A–G) and 8(A–G) are sectional views of processes illustrating methods for manufacturing the transistor units (semiconductor device units) according to the fifth and eighth exemplary embodiments of the present invention, respectively.

Figure 9A:
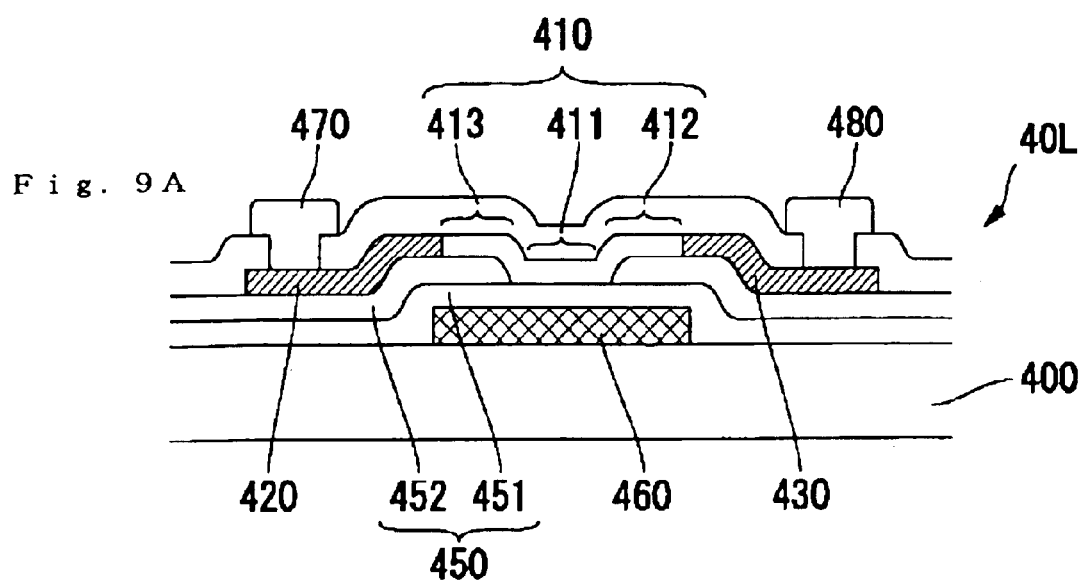
FIGS. 9(A) and (B) are sectional views illustrating structures of transistor units (semiconductor device units) having an LDD structure according to the ninth exemplary embodiment of the present invention, respectively.
Figure 9B:
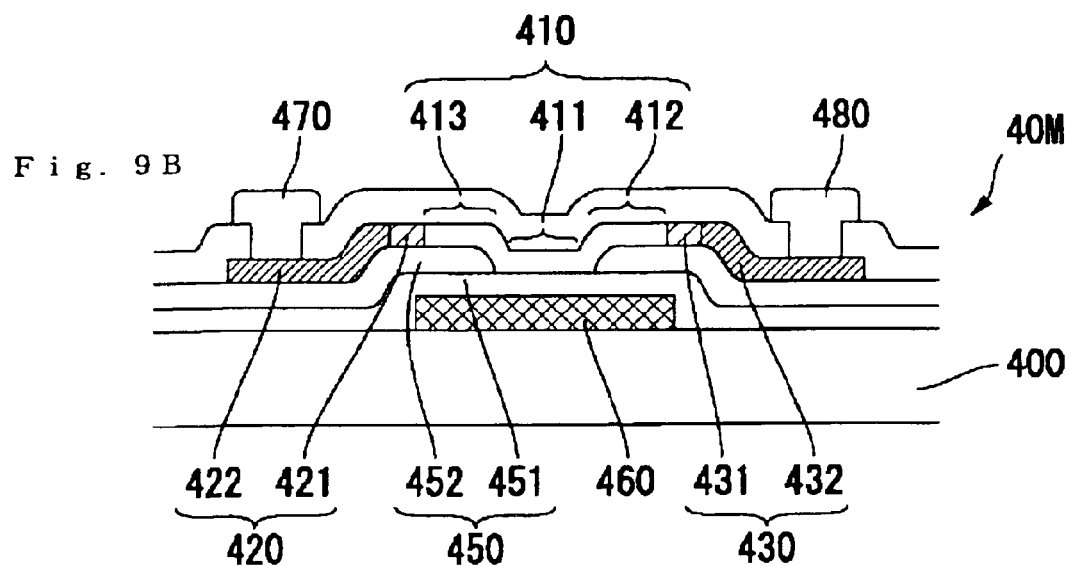

FIGS. 9(A)–9(B) are sectional views illustrating the structure of transistor units (semiconductor device units) having a bottom-gate structure according to the ninth exemplary embodiment of the present invention, respectively.

First Exemplary Embodiment

Figure 1A:
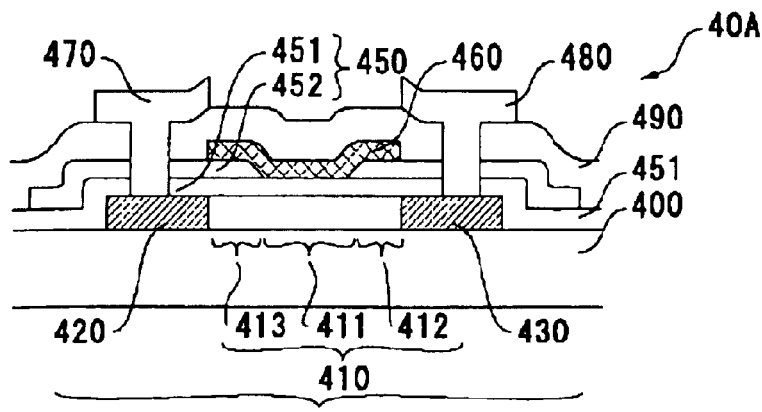
FIGS. 1(A)–(D) are sectional views illustrating structures of transistor units (semiconductor device units) having a self-aligned structure according to the first to fourth exemplary embodiments of the present invention, respectively.
Figure 2:
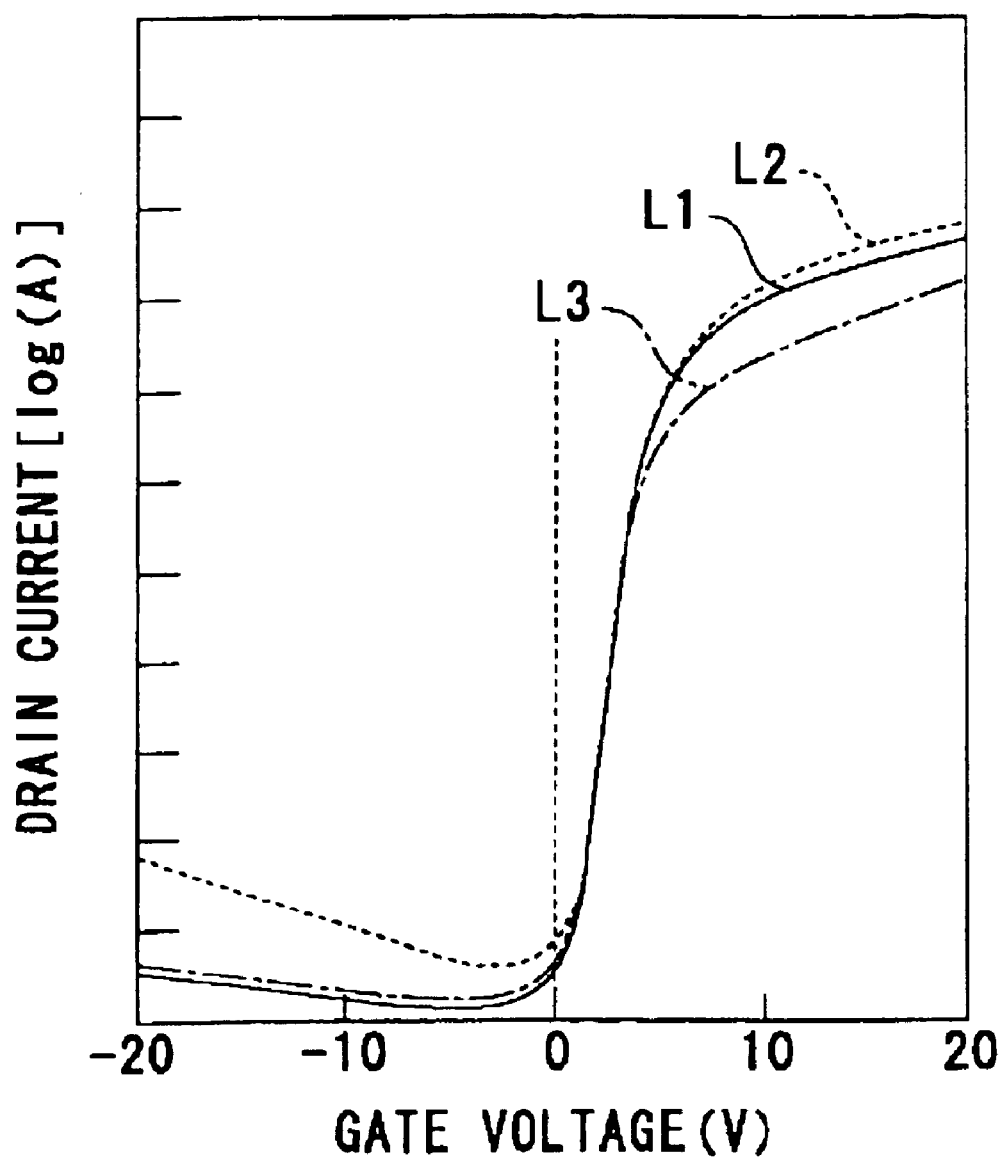
FIG. 2 is a graph illustrating ON current characteristics and OFF leakage current characteristics of the transistors shown in FIGS. 1(A)–(D)

In FIG. 1(A), according to a semiconductor device of the present exemplary embodiment, a transistor 40A, which is formed on a substrate 400, includes a channel formation region 410 for forming a channel between a source region 420 and a drain region 430, and a gate electrode 460 facing the channel formation region with a gate insulating film interposed therebetween. The source region 420 and the drain region 430 are electrically connected through contact holes formed in a interlayer insulating film 490 and the gate insulating film 450 to a source electrode 470 and a drain electrode 480, respectively.

The source region 420 and the drain region 430 are regions heavily doped by a self-aligned method relative to the gate electrode 460.

In the present exemplary embodiment, a part of the gate insulating film 450 overlapping with a boundary region 412 of the channel formation region 410 adjacent to the drain region 430, is thicker than a part of the gate insulating film 450 overlapping with a center part 411 of the channel formation region 410, relative to the longitudinal direction of the channel. A part of the gate insulating film 450 overlapping with a boundary region 413 of the channel formation region 410 adjacent to the source region 420, is also thicker than the part of the gate insulating film 450 overlapping with the center part 411 of the channel formation region 410, relative to the longitudinal direction of the channel.

That is, the gate insulating film 450 includes a lower-layer gate insulating film 451 formed on the entire surface of a semiconductor film 440 including the source region 420, the drain region 430, and the channel formation region 410, and an upper-layer gate insulating film 452 formed not to be overlapped with the center part 411 of the channel formation region 410, relative to the longitudinal direction of the channel. And, parts of the gate insulating film 450 overlapped with the boundary regions 412 and 413 of the channel formation region 410 adjacent to the drain region 430 and the source region 420 have a double-layer structure of the lower-layer gate insulating film 451 and the upper-layer gate insulating film 452. In contrast, a part of the gate insulating film 450 overlapped with the center part 411 of the channel formation region 410, relative to the longitudinal direction of the channel includes only the lower-layer gate insulating film 451.

In the transistor 40A having such structure, the intensity of electric field of the end of a drain is declined because the gate insulating film 450 facing the end of the drain is thick. As a result, as shown with a solid line L1 in FIG. 2, the level of OFF leakage current is low, and the steep rise of current level is reduced or prevented. Also, in the center part 411 of the channel formation region 410, since the gate insulating film 450 is thin and there is also no lightly doped region differently from the LDD-structure, the level of ON current is high. Thus, according to the present exemplary embodiment, both ON current characteristics and OFF leakage current characteristics can be enhanced.

Figure 3A:
FIG. 3 is a sectional view of processes illustrating a method for manufacturing a transistor according to the first exemplary embodiment of the present invention.

In manufacturing a semiconductor device having such structure, first, as shown in FIG. 3(A), a semiconductor film 440, such as a silicon film or the like, is formed on a surface of a substrate 400 to form a channel formation region 410, a source region 420, and a drain region 430. Though not shown in FIG. 3, it is also preferable that a basis insulating film may be formed on the substrate 400, and then the semiconductor film 440 may be formed.

Next, in forming a gate insulating film, a lower-layer gate insulating film 451, which includes a silicon oxide film, silicon nitride film or the like, is formed.

Figure 3B:
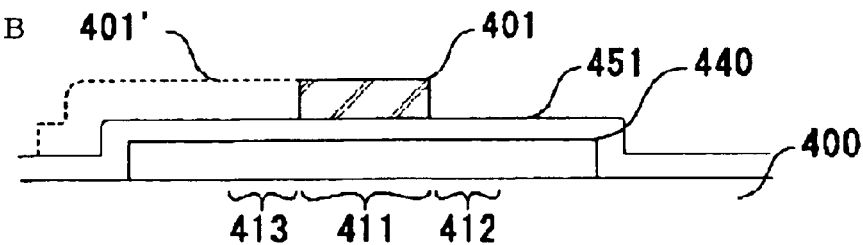

Next, as shown in FIG. 3(B), a resist layer 401 is formed on at least a part of the surface of the lower-layer gate insulating film 451 overlapping with a center part 411 of the channel formation region 410 relative to the longitudinal direction of the channel, except on parts overlapping with boundary regions 412 and 413 of the channel formation region 410 adjacent to the drain region 430 and the source region 420.

Figure 3C:
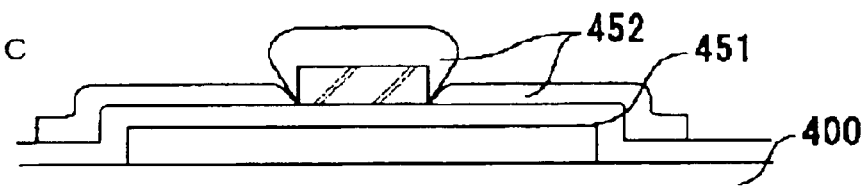

Next, as shown in FIG. 3(C), an upper-layer gate insulating film 452, which includes a silicon oxide film, silicon nitride film or the like, is formed on surfaces of the lower-layer gate insulating film 451 and the resist layer 401. In this case, it is preferable to form the upper-layer gate insulating film 452 using a low-coverage method.

Figure 3D:
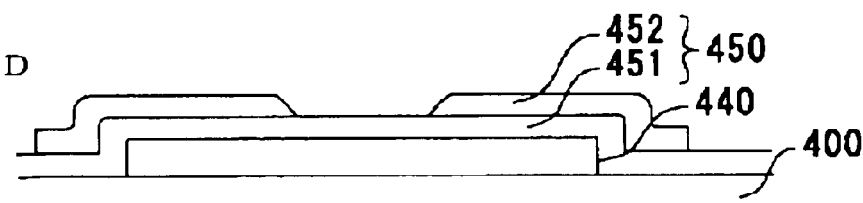

Next, as shown in FIG. 3(D), the resist layer 401 and the upper-layer gate insulating film 452 provided thereon are removed together (a lift-off method). As a result, the gate insulating film 450 includes a thick part having a double-layer structure of the lower-layer gate insulating film 451 and the upper-layer gate insulating film 452, and a thin part including only the lower-layer gate insulating film 451.

Figure 3E:
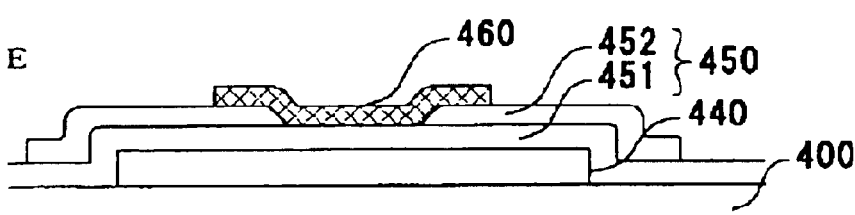
Figure 3F:
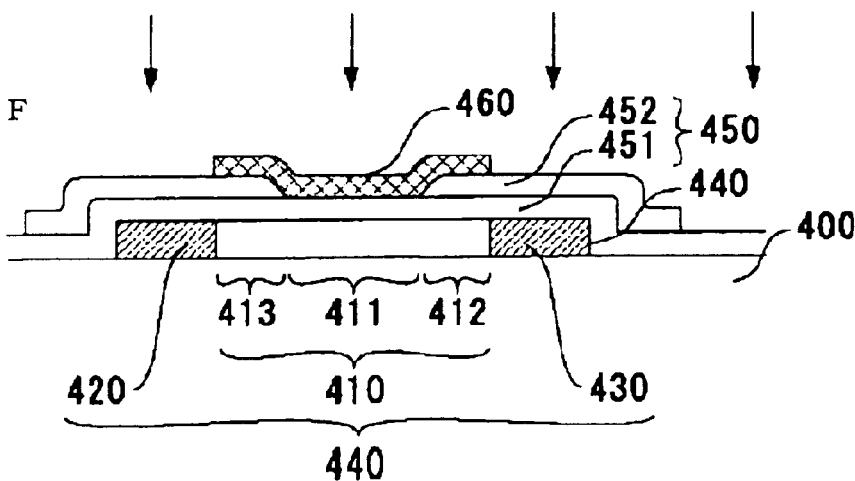

Next, as shown in FIG. 3(E), a gate electrode 460 is formed, and then, as shown in FIG. 3(F), a high-concentration doping agent is injected into the semiconductor film 440 using the gate electrode 460 as a mask, and the source region 420 and the drain region 430 of heavily doped regions are formed using a self-aligned method relative to the gate electrode 460.

Second Exemplary Embodiment

Figure 1B:
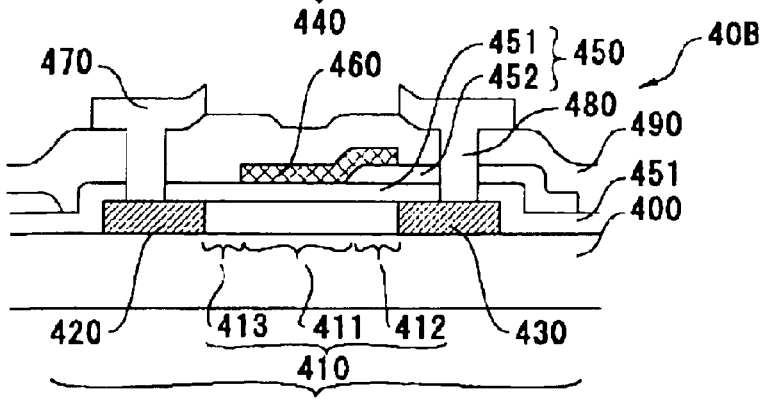

In the method of manufacturing the semiconductor device described in the first exemplary embodiment, in the step explained with reference to FIG. 3(B), if a range of forming the resist layer 401 is expanded to a range of one-dot-chain line 401', a transistor 40B shown in FIG. 1(B) is formed.

In such a transistor 40B, a part of the gate insulating film 450 overlapping with a boundary region 412 of the channel formation region 410 adjacent to the drain region 430, is thicker than a part of the gate insulating film 450 overlapping with a center part 411 of the channel formation region 410, relative to the longitudinal direction of the channel. However, a part of the gate insulating film 450 overlapping with a boundary region 413 of the channel formation region 410 adjacent to the source region 420 is as thick as the part of the gate insulating film 450 overlapping with the center part 411 of the channel formation region 410, relative to the longitudinal direction of the channel.

The other structures are similar to those of the first exemplary embodiment. Thus, like reference numbers represent like parts, and the description thereof will be omitted. However, since the gate insulating film 450 facing the end of the drain are thick in the transistor 40B of the present exemplary embodiment, the intensity of electric field in the end of the drain declines. Therefore, there can be the same effect as the first exemplary embodiment that the level of OFF leakage current can be low and the steep rise of the current level can be reduced or prevented.

Third Exemplary Embodiment

Figure 1C:
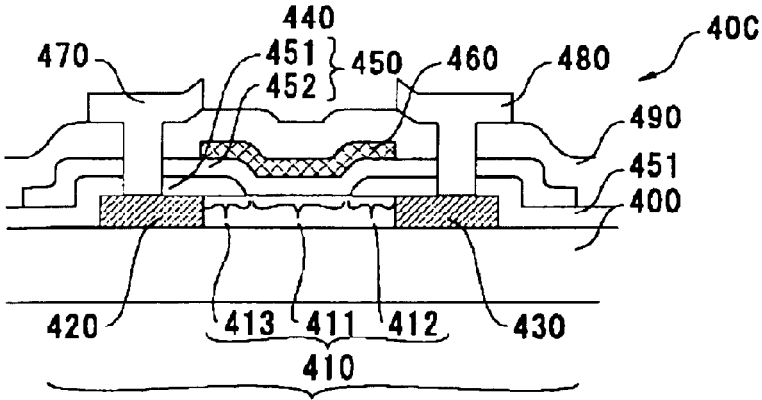

In FIG. 1(C), for a transistor 40C of a semiconductor device according to the present exemplary embodiment, a part of the gate insulating film 450 overlapping with the boundary region 412 of the channel formation region 410 adjacent to the drain region 430, is thicker than a part of the gate insulating film 450 overlapping with the center part 411 of the channel formation region 410, relative to the longitudinal direction of the channel. A part of the gate insulating film 450 overlapping with the boundary region 413 of the channel formation region 410 adjacent to the source region 420, is also thicker than the part of the gate insulating film 450 overlapping with the center part 411 of the channel formation region 410, relative to the longitudinal direction of the channel.

However, for the present exemplary embodiment, in contrast to the first exemplary embodiment, the gate insulating film 450 includes a lower-layer gate insulating film 451 formed not to be overlapped with the center part 411 of the channel formation region 410, relative to the longitudinal direction of the channel, and an upper-layer gate insulating film 452 formed on the entire surface thereof. As a result, parts of the gate insulating film 450 overlapping with the boundary regions 412 and 413 of the channel formation region 410 adjacent to the drain region 430 and the source region 420 have a double-layer structure of the lower-layer gate insulating film 451 and the upper-layer gate insulating film 452. However, a part of the gate insulating film 450 overlapping with the center part 411 of the channel formation region 410, relative to the longitudinal direction of the channel, includes only the upper-layer gate insulating film 452.

In the transistor 40C having such structure, the intensity of electric field in the end of the drain declines since a gate insulating film 450 facing the end of the drain is thick. As a result, the level of OFF leakage current is low, and the steep rise of current level is reduced or prevented. Also, in the center part 411 of the channel formation region 410, since the gate insulating film 450 is thin and there is also no lightly doped region differently from the LDD-structure, the level of ON current is high. Thus, according to the present exemplary embodiment, both ON current characteristics and OFF leakage current characteristics can be enhanced.

In manufacturing a semiconductor device having such structure, first, as shown in FIG. 4(A), a semiconductor film 440 is formed on a surface of a substrate 400 to form a channel formation region 410, a source region 420, and a drain region 430.

Next, in forming a gate insulating film, a resist layer 401 is formed on at least a part of the semiconductor film 440 overlapping with a center part 411 of the channel formation region 410, relative to the longitudinal direction of the channel, except on parts overlapping with boundary regions 412 and 413 of the channel formation region 410 adjacent to the drain region 430 and the source region 420.

Next, as shown in FIG. 4(B), a lower-layer gate insulating film 451 is formed on surfaces of the semiconductor film 440 and the resist layer 401. Then, as shown in FIG. 4(C), the resist layer 401 and the lower-layer gate insulating film 451 formed thereon, are removed together by the lift-off method. Furthermore, without using the lift-off method described above, after the lower-layer gate insulating film 451 is formed on the semiconductor film 440, a resist layer may be formed and patterned.

Next, as shown in FIG. 4(D), an upper-layer gate insulating film 452 is formed on the entire surface. As a result, the gate insulating film 450 includes a thick part having a double-layer structure of the lower-layer gate insulating film 451 and the upper-layer gate insulating film 452, and a thin part including only the lower-layer gate insulating film 451.

Next, as shown in FIG. 4(E), a gate electrode 460 is formed, and then, as shown in FIG. 4(F), a high-concentration doping agent is injected into the semiconductor film 440 using the gate electrode 460 as a mask. Then, a source region 420 and a drain region 430 of heavily doped regions are formed by a self-aligned method relative to the gate electrode 460.

Fourth Exemplary Embodiment

Figure 1D:
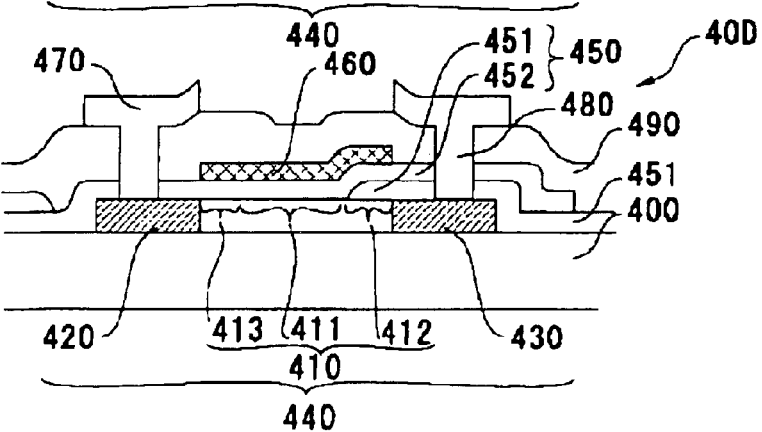

In the method of manufacturing the semiconductor device described in the third exemplary embodiment, in the step explained with reference to FIG. 4(A), if a range of forming the resist layer 401 is expanded to a range of one-dot-chain line 401', a transistor 40D shown in FIG. 1(D) is formed.

In the transistor 40D, a part of the gate insulating film 450 overlapping with the boundary region 412 of the channel formation region 410 adjacent to the drain region 430 is thicker than a part of the gate insulating film 450 overlapping with the center part 411 of the channel formation region 410 relative to the longitudinal direction of the channel. However, a part of the gate insulating film 450 overlapping with the boundary region 412 of the channel formation region 410 adjacent to the source region 420, is as thick as the part of the gate insulating film 450 overlapping with the center part 411 of the channel formation region 410, relative to the longitudinal direction of the channel.

The other structures are similar to those of the third exemplary embodiment, and like reference numbers represent like parts. Therefore, the description thereof will be omitted. However, since the gate insulating film 450 facing the end of the drain are thick in the transistor 40D of the present exemplary embodiment, the intensity of electric field in the end of the drain declines. Thus, there can be the same effect as the third exemplary embodiment that the level of OFF leakage current can be low and the steep rise of the current level can be avoided.

Fifth Exemplary Embodiment

Figure 5A:
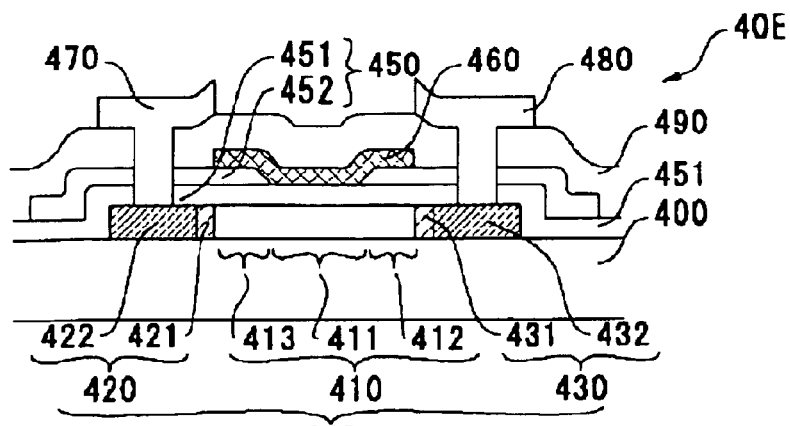
FIGS. 5(A)–(D) are sectional views illustrating structures of transistor units (semiconductor device units) having an LDD structure according to the fifth to eighth exemplary embodiments of the present invention, respectively.
Figure 6:
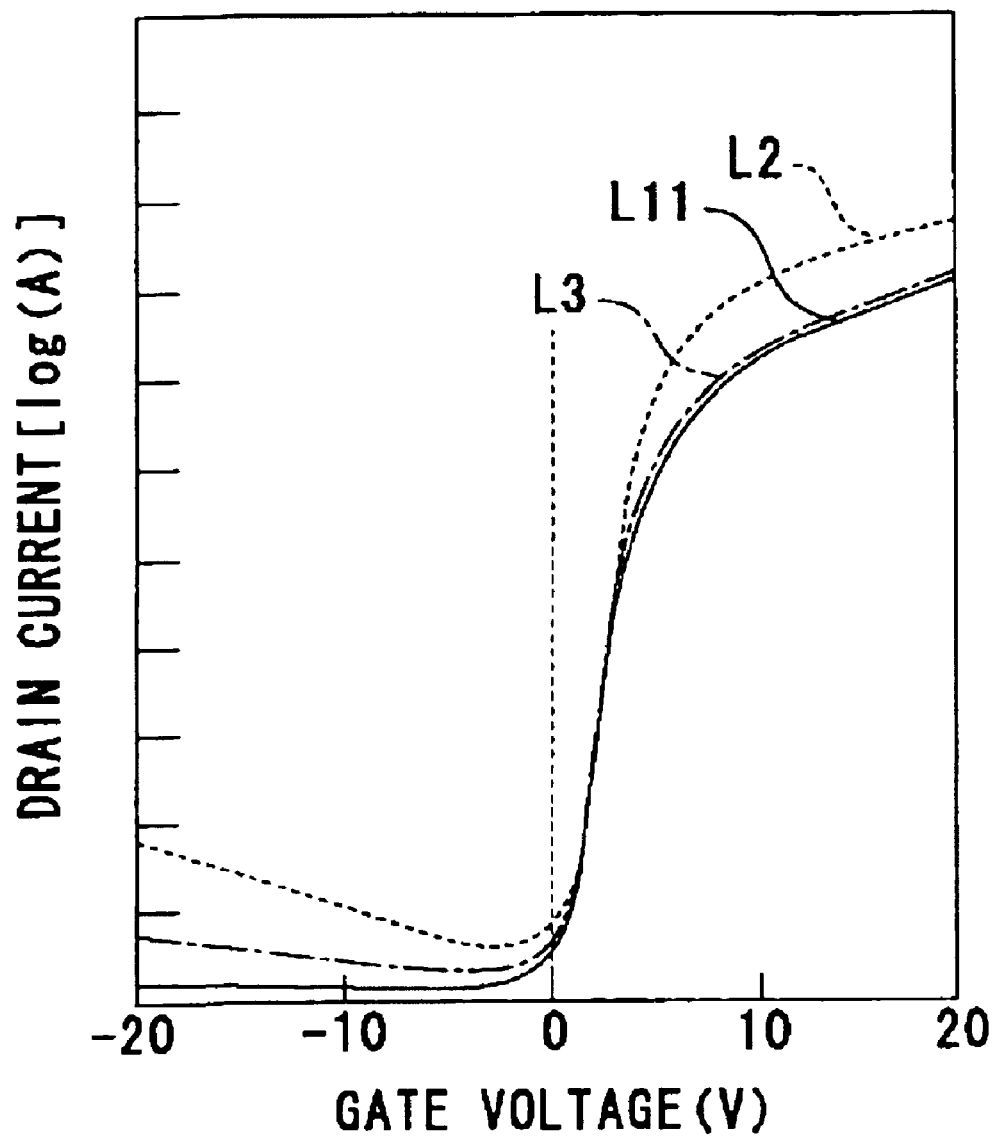
FIG. 6 is a graph illustrating ON current characteristics and OFF leakage current characteristics of the transistors shown in FIG. 5(A)–(D)

In FIG. 5(A), for a semiconductor device of the present exemplary embodiment, a transistor 40E having an LDD-structure, which is formed on a substrate 400, includes a channel formation region 410 to form a channel between a source region 420 and a drain region 430, and a gate electrode 460 facing the channel formation region with a gate insulating film 450 interposed therebetween. The source region 420 and the drain region 430 are electrically connected through contact holes formed in a interlayer insulating film 490 and the gate insulating film 450 to a source electrode 470 and a drain electrode 480, respectively.

The source region 420 and the drain region 430 include a lightly doped source region 421 and a lightly doped drain region 431 facing the end of the gate electrode 460 with the gate insulating film 450 interposed therebetween, and a heavily doped source region 422 and a heavily doped drain region 432, which are located at the outside of the lightly doped source region 421 and the lightly doped drain region 431, respectively.

In the present exemplary embodiment, a part of the gate insulating film 450 overlapping with a boundary region 412 of the channel formation region 410 adjacent to the lightly doped drain region 431, is thicker than a part of the gate insulating film 450 overlapping with a center part 411 of the channel formation region 410, relative to the longitudinal direction of the channel. Furthermore, a part of the gate insulating film 450 overlapping with a boundary region 413 of the channel formation region 410 adjacent to the lightly doped source region 421, is thicker than the part of the gate insulating film 450 overlapping with the center part 411 of the channel formation region 410, relative to the longitudinal direction of the channel.

That is, the gate insulating film 450 includes a lower-layer gate insulating film 451 formed on the entire surface of a semiconductor film 440 including the source region 420, the drain region 430, and the channel formation region 410, and an upper-layer gate insulating film 452 formed not to be overlapped with the center part 411 of the channel formation region 410 relative to the longitudinal direction of the channel. And, parts of the gate insulating film 450 overlapping with the boundary regions 412 and 413 of the channel formation region 410 adjacent to the lightly doped drain region 431 and the lightly doped source region 421, have a double-layer structure of the lower-layer gate insulating film 451 and the upper-layer gate insulating film 452. In contrast, a part of the gate insulating film 450 overlapping with the center part 411 of the channel formation region 410, relative to the longitudinal direction of the channel, includes only the lower-layer gate insulating film 451.

In the transistor 40E having such structure, since the gate electrode 460 includes the lightly doped source region 421 and the lightly doped drain region 431 facing the gate electrode 460, with the gate insulating film 450 interposed therebetween, as shown with a solid line L11 in FIG. 6, the intensity of electric field of the end of a drain declines, and thus the level of OFF leakage current is low. Furthermore, since the gate insulating film 450 facing one end of the drain is thick and thus the intensity of electric field of the end of the drain is further declines, the level of OFF leakage current is low, and the steep rise of current level is reduced or avoided. However, in the center part 411 of the channel formation region 410, since the gate insulating film 450 is thin, the level of ON current is high in contrast to the low level of OFF leakage current.

In manufacturing a semiconductor device having such structure, first, as shown in FIG. 7(A), a semiconductor film 440, such as a silicon film or the like, is formed on a surface of a substrate 400 to form a channel formation region 410, a source region 420, and a drain region 430.

Next, in forming a gate insulating film, a lower-layer gate insulating film 451, which includes a silicon oxide film, a silicon nitride film or the like, is formed.

Next, as shown in FIG. 7(B), a resist layer 401 is formed on at least a part of the surface of the lower-layer gate insulating film 451 overlapping with a center part 411 of the channel formation region 410 relative to the longitudinal direction of the channel, except on parts overlapping with boundary regions 412 and 413 of the channel formation region 410 adjacent to the lightly doped drain region 431 and the lightly doped source region 421.

Next, as shown in FIG. 7(C), an upper-layer gate insulating film 452, which includes a silicon oxide film, a silicon nitride film or the like, is formed on surfaces of the lower-layer gate insulating film 451 and the resist layer 401. For example, when the lower-layer gate insulating 451 is a silicon oxide film the upper-layer gate insulating film 452 may be a silicon nitride film, and vice versa. In this case, it is preferable to form the upper-layer gate insulating film 452 using a low-coverage method.

Next, as shown in FIG. 7(D), the resist layer 401 and the upper-layer gate insulating film 452 provided thereon are removed together (a lift-off method). As a result, the gate insulating film 450 includes a thick part having a double-layer structure of the lower-layer gate insulating film 451 and the upper-layer gate insulating film 452, and a thin part including only the lower-layer gate insulating film 451.

Next, as shown in FIG. 7(E), a gate electrode 460 is formed, and then, as shown in FIG. 7(F), a low-concentration doping agent is injected into the semiconductor film 440 using the gate electrode 460 as a mask. Then, a lightly doped source region 421 and a lightly doped drain region 431 are formed by a self-aligned method relative to the gate electrode 460.

Then, as shown in FIG. 7(G), after a resist mask 402 is formed to broadly cover the gate electrode 460, a high-concentration doping agent is injected through openings of the resist mask 402 into the semiconductor film 440. Then, a heavily doped source region 422 and a heavily doped drain region 432 are formed at the outwardly deviated parts facing both ends of the gate electrode 460 with the gate insulating film 450 interposed therebetween, respectively. As a result, the lightly doped source region 421 and the lightly doped drain region 431 are formed at parts facing both ends of the gate electrode 460 with the gate insulating film 450 interposed therebetween, respectively.

Sixth Exemplary Embodiment

Figure 5B:
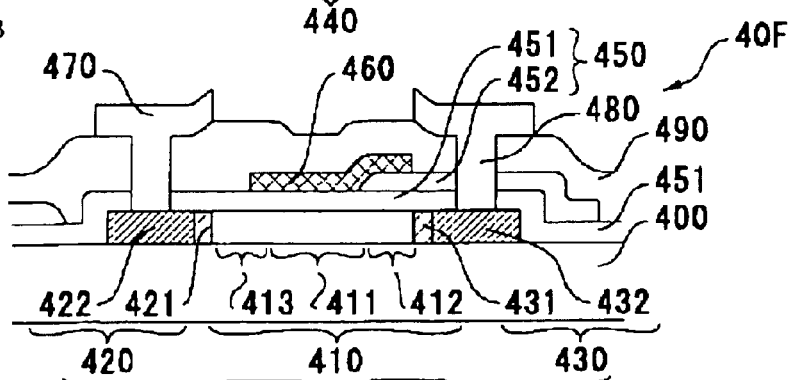

In the method of manufacturing the semiconductor device described in the fifth exemplary embodiment, in the step explained with reference to FIG. 7(B), when a range of forming the resist layer 401 is expanded to a range of one-dot-chain line 401', a transistor 40F shown in FIG. 5(B) is formed.

In the transistor 40F, a part of the gate insulating film 450 overlapping with a boundary region 412 of the channel formation region 410 adjacent to the lightly doped drain region 430, is thicker than a part of the gate insulating film 450 overlapping with a center part 411 of the channel formation region 410, relative to the longitudinal direction of the channel. However, a part of the gate insulating film 450 overlapping with a boundary region 413 of the channel formation region 410 adjacent to the lightly doped source region 421, is as thick as the part of the gate insulating film 450 overlapping with the center part 411 of the channel formation region 410, relative to the longitudinal direction of the channel.

The other structures are similar to those of the fifth exemplary embodiment, and like reference numbers represent like parts. Therefore, the description thereof will be omitted. And, for the transistor 40F of the present exemplary embodiment, there is the same effect as the fifth exemplary embodiment that the level of ON current is high in contrast to the low level of OFF leakage current.

Seventh Exemplary Embodiment

Figure 5C:
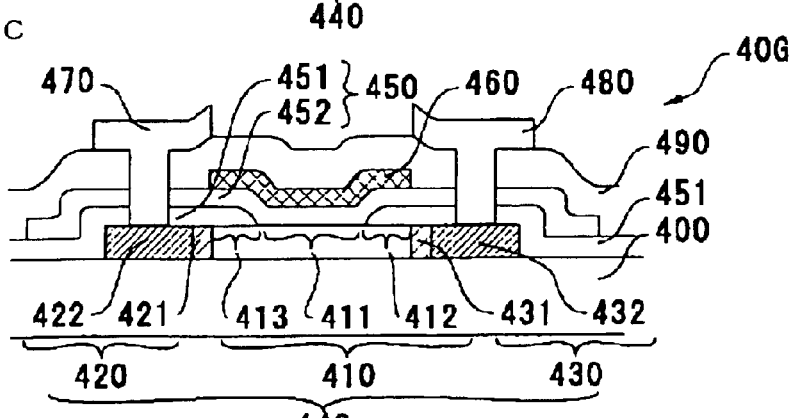

In FIG. 5(C), for a transistor 40G of a semiconductor device according to the present exemplary embodiment, a part of the gate insulating film 450 overlapping with a boundary region 412 of the channel formation region 410 adjacent to the lightly doped drain region 431, is thicker than a part of the gate insulating film 450 overlapping with a center part 411 of the channel formation region 410, relative to the longitudinal direction of the channel. A part of the gate insulating film 450 overlapping with a boundary region 413 of the channel formation region 410 adjacent to the lightly doped source region 421, is also thicker than the part of the gate insulating film 450 overlapping with the center part 411 of the channel formation region 410, relative to the longitudinal direction of the channel.

However, according to the present exemplary embodiment, in contrast to the fifth exemplary embodiment, the gate insulating film 450 includes a lower-layer gate insulating film 451 formed not to be overlapped with the center part 411 of the channel formation region 410 relative to the longitudinal direction of the channel, and an upper-layer gate insulating film 452 formed on the entire surface thereof. As a result, parts of the gate insulating film 450 overlapping with the boundary regions 412 and 413 of the channel formation region 410 adjacent to the drain region 430 and the source region 420 have a double-layer structure of the lower-layer gate insulating film 451 and the upper-layer gate insulating film 452. In contrast, a part of the gate insulating film 450 overlapping with the center part 411 of the channel formation region 410, relative to the longitudinal direction of the channel, includes only the upper-layer gate insulating film 452.

In the transistor 40G having such structure, there is the same effect as the fifth exemplary embodiment that the level of ON current is high in contrast to the low level of OFF leakage current.

In manufacturing a semiconductor device having such structure, first, as shown in FIG. 8(A), a semiconductor film 440 is formed on a surface of a substrate 400 to form a channel formation region 410, a source region 420, and a drain region 430.

Next, in a step of forming the gate insulating film, a resist layer 401 is formed on at least a part of the semiconductor film 440 overlapping with a center part 411 of the channel formation region 410, relative to the longitudinal direction of the channel, and the resist layer 401 is not formed on parts overlapping with boundary regions 412 and 413 of the channel formation region 410 adjacent to the lightly doped drain region 431 and the lightly doped source region 421.

Next, as shown in FIG. 8(B), a lower-layer gate insulating film 451 is formed on surfaces of a semiconductor film 440 and the resist layer 401. Then, as shown in FIG. 8(C), the resist layer 401 and the lower-layer gate insulating film 451 provided thereon are removed simultaneously.

Next, as shown in FIG. 8(D), an upper-layer gate insulating film 452 is formed on the entire surface. As a result, the gate insulating film 450 includes a thick part having a double-layer structure of the lower-layer gate insulating film 451 and the upper-layer gate insulating film 452, and a thin part including only the upper-layer gate insulating film 452.

Next, as shown in FIG. 8(E), a gate electrode 460 is formed, and then, as shown in FIG. 8(F), a low-concentration doping agent is injected into the semiconductor film 440 using the gate electrode 460 as a mask. Then, a lightly doped source region 421 and a lightly doped drain region 431 are formed using a self-aligned method relative to the gate electrode 460.

Then, as shown in FIG. 8(G), after a resist mask 402 is formed to cover the gate electrode 460, a high-concentration doping agent is injected into the semiconductor film 440 through openings of the resist mask 402, so that a heavily doped source region 422 and a heavily doped drain region 432 are formed at the outside of parts of the semiconductor film 400 facing both ends of the gate electrode 460 with the gate insulating film 450 interposed therebetween, respectively. As a result, a lightly doped source region 421 and a lightly doped drain region 431 are formed at parts facing the ends of the gate electrode 460 with the gate insulating film 450 interposed therebetween, respectively.

Eighth Exemplary Embodiment

Figure 5D:
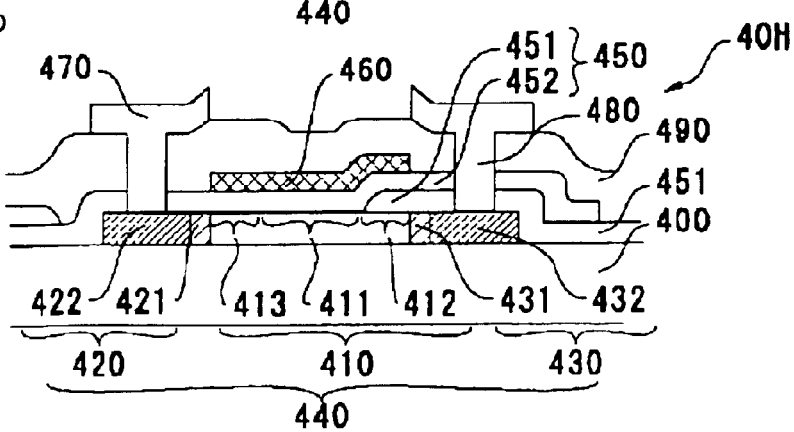

In the method of manufacturing the semiconductor device described in the seventh exemplary embodiment, in the step explained with reference to FIG. 8(A), when a range of forming the resist layer 401 is expanded to a range of one-dot-chain line 401', a transistor 40H shown in FIG. 5(D) is formed.

In the transistor 40H, a part of the gate insulating film 450 overlapping with a boundary region 412 of the channel formation region 410 adjacent to the lightly doped drain region 431, is thicker than a part of the gate insulating film 450 overlapping with a center part 411 of the channel formation region 410, relative to the longitudinal direction of the channel. However, a part of the gate insulating film 450 overlapping with a boundary region 413 of the channel formation region 410 adjacent to the lightly doped source region 421, is as thick as the part of the gate insulating film 450 overlapping with the center part 411 of the channel formation region 410, relative to the longitudinal direction of the channel.

The other structures are similar to those of the seventh exemplary embodiment. Thus, like reference numbers represent like parts, and the description thereof will be omitted. Furthermore, in the transistor 40H of the present exemplary embodiment, there can be the same effect as the fifth exemplary embodiment that the level of ON current is high in contrast to the low level of OFF leakage current.

Ninth Exemplary Embodiment

Although a transistor having a top-gate-type self-aligned structure is applied to the first to fourth exemplary embodiments, the present invention may be applied to the transistor 40L having a bottom-gate-type self-aligned structure as shown in FIG. 9(A).

Although a transistor having a top-gate-type LDD structure is applied to the fifth to eighth exemplary embodiments, the present invention may be applied to the transistor 40M having a bottom-gate-type LDD structure as shown in FIG. 9(B).

In comparison with the first to eighth exemplary embodiments, the basic structure of the transistors 40L and 40M is equal to those of the first to eighth exemplary embodiments, except that positions of the gate electrode 460 and the channel formation region 410 relative to the gate insulating film 450 are vertically reversed. Thus, like reference numbers represent like parts, and the description thereof will be omitted.

Also, a method for manufacturing the same includes forming the gate insulating film as explained with reference to FIG. 3 or 7. Therefore, forming the gate insulating film is performed in the following order: a lower-layer gate insulating film 451 is formed, and then, a resist layer is selectively formed on at least a part of the lower-layer gate insulating film 451 overlapping with a center part 411 of a channel formation region 410 relative to the longitudinal direction of the channel, Next, an upper-layer gate insulating film 452 is formed on surfaces of the lower-layer gate insulating film 451 and the resist layer, and then the resist layer and the upper-layer gate insulating film 452 formed thereon are removed together.

Furthermore, as explained with reference to FIG. 4 or 8, in forming the gate insulating film, the resist layer is selectively formed on a part overlapping with the center part 411 of the channel formation region 410, relative to the longitudinal direction of the channel, and then the lower-layer gate insulating film 451 is formed on a surface of the resist layer. Next, the resist layer and the lower-layer gate insulating film 451 formed thereon are removed together, and then the upper-layer gate insulating film 452 is formed on the entire surface.

Other Exemplary Embodiments

In the first to ninth exemplary embodiments described above, a TFT is manufactured by using the semiconductor film 440 formed on the substrate 400. However, a semiconductor layer epitaxially grown on a semiconductor substrate or a surface of the semiconductor substrate itself can be used as the semiconductor layer. The structure and the manufacturing method of this case will not be described because their semiconductor layers are only replaced with the semiconductor film 440.

Furthermore, in the fifth to eighth exemplary embodiments, the present invention is applied on the basis of an LDD-structure TFT. However, the present invention is applied on the basis of an offset-gate-structure TFT. In such a case, the lightly doped source region 421 and the lightly doped drain region 431, shown in FIG. 5, are offset regions, in which the impurity density thereof is equal to that of the channel formation region 410, respectively. Thus, the method of manufacturing the same will not be described because the lightly doping step explained with reference to FIGS. 7(F) and 8(F) is only omitted.

Application Example for Electro-Optical Device

Next, an example where a semiconductor device according to the present invention is used as a substrate (a TFT array substrate) for an electro-optical device to hold an electro-optical material will be explained.

General Structure

Figure 10:
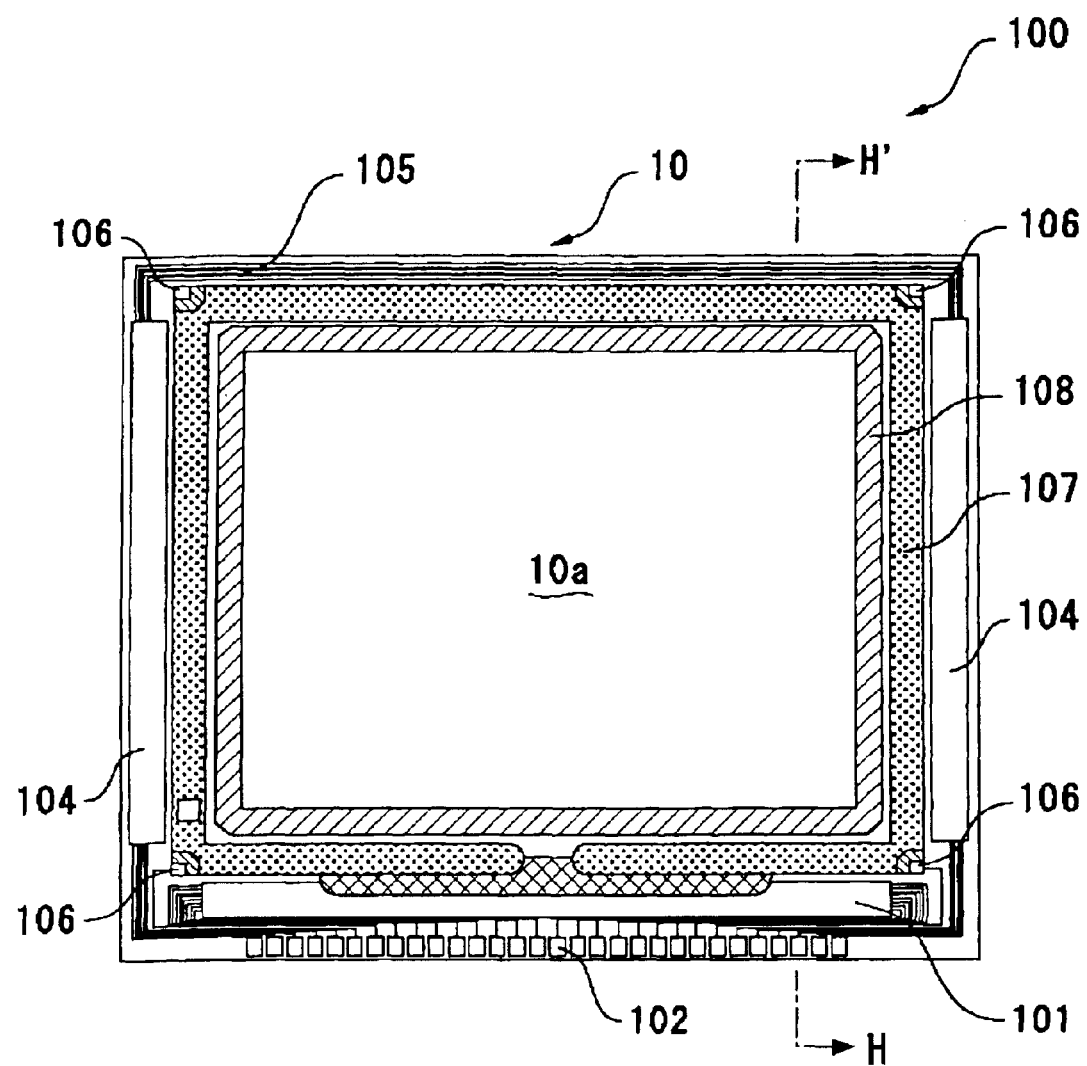
FIG. 10 is a plan view from a counter substrate illustrating an electro-optical device according to the present invention and each component formed thereon.
Figure 11:
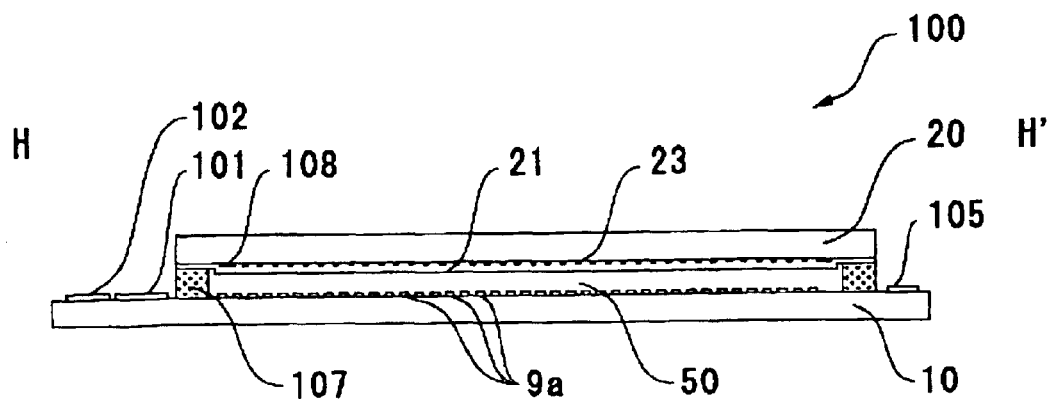
FIG. 11 is a sectional view taken along the plane H–H' shown in FIG. 10.

FIG. 10 is a plan view from a counter substrate illustrating an electro-optical device and each component formed thereon. FIG. 11 is a sectional view including the counter substrate taken along the plane H–H' shown in FIG. 10.

In FIG. 10, an electro-optical device 100, according to present invention is an active-matrix-type liquid crystal device in which a sealing material 107 is provided along the edge of a counter substrate 20 on a TFT array substrate 10. In an outer portion of the sealing material 107, a data-line driving circuit 101 and mounting terminals (signal input terminals) 102 are provided along a first side of the TFT array substrate 10, and scanning-line driving circuits 104 are formed along two sides adjacent to the first side. Furthermore, a plurality of wiring lines 105, to connect the scanning-line driving circuits 104 to each other, and formed at both sides of a image display region 10a, are provided at the other side of the TFT array substrate 10, and a pre-charge circuit or an inspection circuit may be formed using an underside of frame 108. Moreover, top-bottom connection members 106 to electrically connect the TFT array substrate 10 to the counter substrate 20 are formed in at least one of four corners of the counter substrate 20.

As shown in FIG. 11, the counter substrate 20, the contour thereof equal to that of the sealing material 107 shown in FIG. 10, adheres to the TFT array substrate 10 through the sealing material 107. Furthermore, the sealing material 107 is an adhesive agent, which is made of radiation curable resin, thermally reinforced resin or the like, to adhere edges of the TFT array substrate 10 to edges of the counter substrate 20 each other. Gap materials, such as glass fiber and glass beads, to set a length between both substrates to a predetermined value is mixed in the sealing material 107.

Although details will be described below, pixel electrodes 9a are formed on the TFT array substrate 10 in a matrix. In contrast, on the counter substrate 20, the frame 108 made of light shielding material is formed at the inner region of the sealing material 107, and the image display region 10a is formed inside the frame 108. Furthermore, light shielding film 23 called a black matrix or a black stripe and the like is formed at parts facing horizontal and vertical boundary regions of pixel electrodes (described below) formed on the TFT array substrate 10, and a counter electrode 21 made of an ITO film is formed on the upper side thereof.

When the electro-optical device 100 of the aforementioned constitution is used in a projection-type display device (a liquid crystal projector), three electro-optical devices 100 are used as light valves for RGB, respectively, and each light separated by dichroic mirrors for RGB color separation is incident on each electro-optical device 100 as projection light. Thus, a color filter is not formed in each electro-optical device 100 described above. However, since RGB color filters and a passivation thereof are formed at parts of the counter substrate 20 facing the respective pixel electrode 9a, the device 100 can be used as a color display device of an electronic apparatus, such as a mobile computer, a cellular phone, a liquid crystal TV and the like, beside the projection-type display device.

Furthermore, a plurality of micro-lenses are formed on the counter substrate 20, such that the plurality of micro-lens corresponds to the respective pixels. Thus, the concentration efficiency of an incident beam to the pixel electrodes 9a can be enhanced, and brighter display can be accomplished. Moreover, by depositing interference layers having different refractive index from any layer, it is preferable to form a dichroic filter generating RGB color using the interference operation of light. When using the counter substrate having the dichroic filter, it is possible to display brighter color.

Structure and Operation of the Electro-Optical Device 100

Next, the structure and operation of the active-matrix-type electro-optical device 100 will be described with reference to FIGS. 12 to 14.

Figure 12:
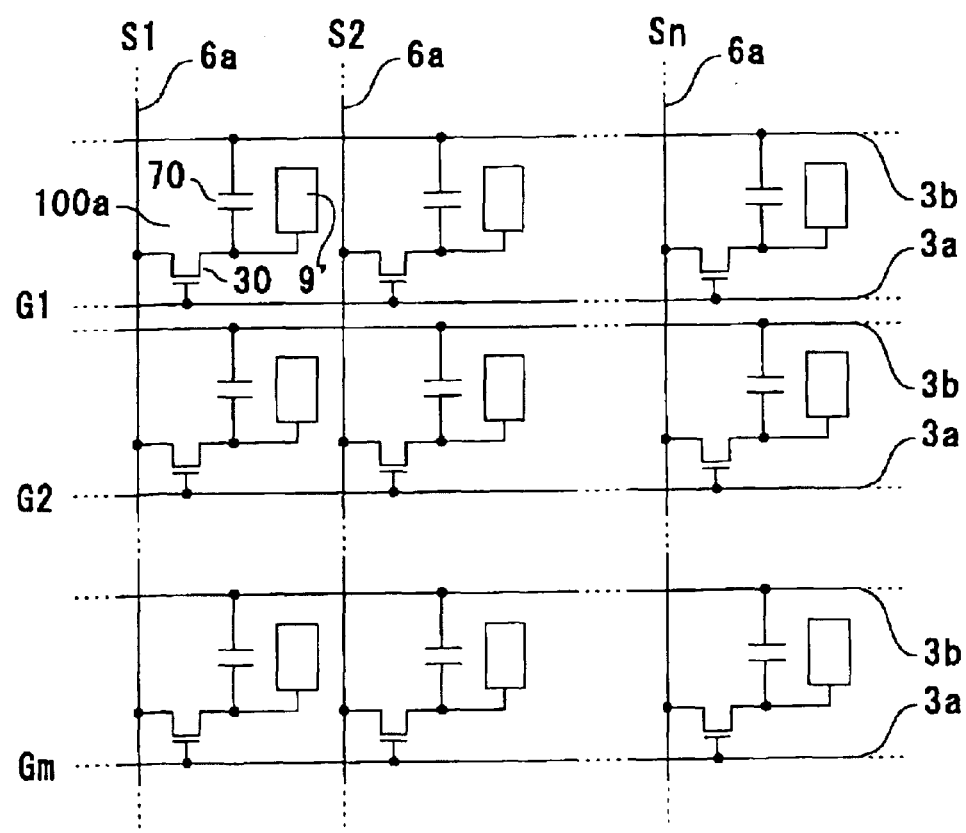
FIG. 12 is an equivalent circuit of various sorts of elements and wiring lines formed in a matrix shape within a plurality of pixels in an image display region of an electro-optical device.

FIG. 12 is an equivalent circuit of elements and wiring lines in a plurality of pixels provided in a matrix to compose an image display region 10a of an electro-optical device 100. FIG. 13 is a plan view illustrating each pixel adjacent to each other formed in a TFT array substrate on which data lines, scanning lines, pixel electrodes, and the like are formed. FIG. 14 is a schematic illustrating a sectional view taken along the plane A–A' shown in FIG. 13, and a sectional view of a structure where liquid as an electro-optical material is sealed between the TFT array substrate and the counter substrate. Furthermore, in these figures, each layer or each member has a different reduced scale to show each layer or each member to be recognized.

In FIG. 12, in the image display region 10a of the electro-optical device 100, a pixel electrode 9a and a pixel switching TFT 30 to control the pixel electrode 9a are formed in each of the plurality of pixels formed in a matrix, and a data line 6a to supply pixel signals is electrically connected to the TFT 30. Pixel signals S1, S2, . . . , Sn written into the data line 6a is line-sequentially supplied in this order. Also, a scanning line 3a is electrically connected to a gate of the TFT 30, and at a predetermined timing, scanning signals G1, G2, . . . , Gm are line-sequentially supplied to the scanning lines 3a as a pulse in this order. The electrode 9a is electrically connected to a drain of the TFT 30, and pixel signals S1, S2, . . . , Sn supplied from the data line 6a is written into each pixel at a predetermined timing by switching the pixel switching TFT 30 an ON state for a predetermined period of time. As a result, a predetermined level of pixel signals S1, S2, . . . , Sn written into liquid through the pixel electrode 9a is held in a counter electrode 21 (refer to FIG. 11) formed on the counter substrate 20 for a predetermined period of time.

Herein, in order to prevent the held pixel signals from leaking, a storage capacitor 70 (a capacitor) may be additionally provided in parallel with a liquid capacitance formed between the pixel electrode 9a and the counter electrode. By such a storage capacitor 70, a voltage of the pixel electrode 9a can be held for a time longer than a source voltage applied time by three digits. As a result, the holding characteristic of charge can be enhanced, so that an electro-optical device capable of displaying an image with high contrast can be implemented. Also, the storage capacitor 70 may be formed between the capacitance lines 3b that are wiring lines for forming capacitance or between the front scanning lines 3a.

Figure 13:
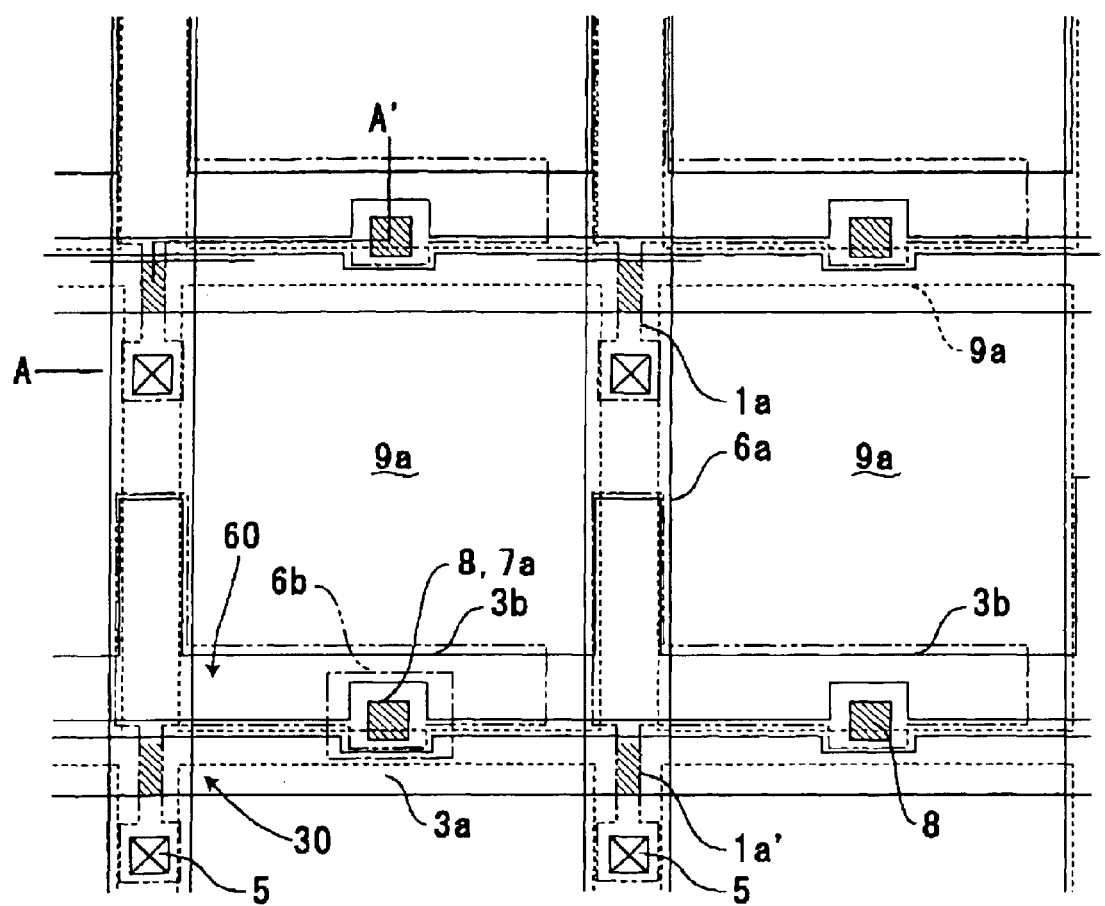
FIG. 13 is a plan view illustrating the structure of each pixel formed on a TFT array substrate of an electro-optical device.

In FIG. 13, on the TFT array substrate 10 of the electro-optical device 100, a plurality of transparent pixel electrodes 9a (regions surrounded by dotted lines) are formed at each pixel in a matrix, and data lines 6a (one-dot-chain line), scanning lines 3a (solid line), and capacitance lines 3b (solid line) are formed along horizontal and vertical boundary regions of the pixel electrode 9a.

Figure 14:
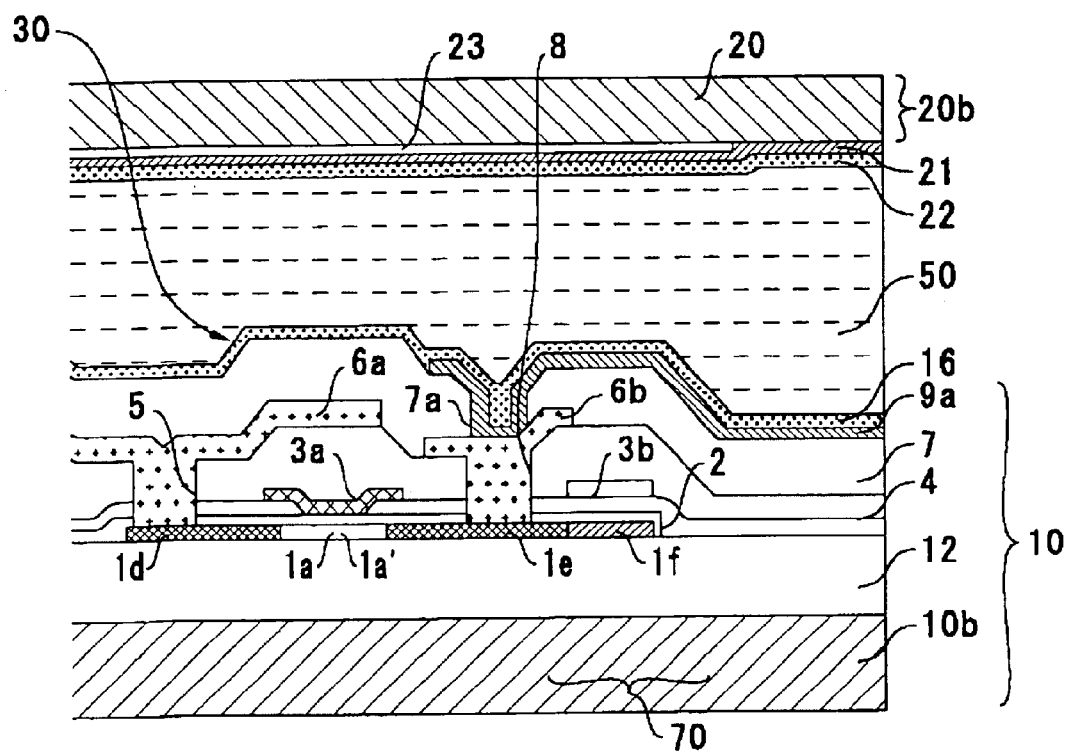
FIG. 14 is a sectional view illustrating a portion of the image display region of the electro-optical device shown in FIGS. 10 and 11 taken along the plane A–A' shown in FIG. 13.

As shown in FIG. 14, a body of the TFT array substrate 10 is made of a transparent substrate 10b such as a quartz substrate, heat-resisting glass plate, and the like, and a body of the counter substrate 20 is made of a transparent substrate 20b such as a quartz substrate, heat-resisting glass plate, and the like. The pixel electrode 9a is formed on the TFT array substrate 10, and an alignment layer 16 made of, for example, a polyimide film performed by a predetermined alignment process, such as a rubbing process, is formed on the pixel electrode 9a. The pixel electrode 9a is made of a transparent conductive film such as an ITO (an Indium Tin Oxide) film. Also, the alignment layer 16 is formed by performing the rubbing process on an organic film such as a polyimide film. An alignment layer 22 made of the polyimide film is also formed on the upper side of the counter electrode 21, and the alignment layer 22 is also obtained by performing the rubbing process on the polyimide film.

In the TFT array substrate 10, a base passivation 12 is formed on a surface of the transparent substrate 10b, and on the surface of the base passivation 12, the pixel switching transistor TFT 30 to switch each pixel electrode 9a is formed at a position adjacent to each pixel electrode 9a.

As shown in FIGS. 13 and 14, in the pixel switching transistor TFT 30, a channel formation region 1a', a heavily doped source region 1d, and a heavily doped drain region 1e are formed in a semiconductor film 1a made of a silicon film having a island shape. Also, a gate insulating film 2 is formed on the upper layer side of the semiconductor film 1a to isolate the semiconductor film 1a from a scanning line 3a.

Herein, although the heavily doped source region 1d and the heavily doped drain region 1e are formed in a self-aligned method relative to the gate electrode (scanning line 3a), the TFT 30 has the structure explained with reference to FIG. 1(A), and the gate insulating film 2 facing one end of the drain is thick. Thus, since in TFT 30, the intensity of electric field of one end of the drain declines, the level of OFF current is low, and a sudden rise of the current level is reduced or prevented. Furthermore, since in a center part of the channel formation region 1a', the gate insulating film 2 is thin and there is no lightly doped region on contrary to an LDD structure, the level of ON current is high.

Furthermore, in FIG. 14, a TFT having a structure explained with reference to FIG. 1(A) is shown as a TFT 30. However, it is not limited to that shown in FIG. 1(A), but TFTs having structures shown in FIGS. 1(B) to 1(D), FIGS. 5(A) to 5(D), and FIGS. 6(A) to 6(B) may be used as the TFT 30.

Interlayer insulating films 4 and 7 made of a silicon oxide film are formed on the surface of the TFT 30 having such structure. A data line 6a is formed on a surface of the interlayer insulating film 4, and is electrically connected to the heavily doped source region 1d through a contact hole 5 formed in the interlayer insulating film 4. A pixel electrode 9a made of an ITO film is formed on the surface of the interlayer insulating film 7. The pixel electrode 9a is electrically connected to the drain electrode 6b through a contact hole 7a formed in the interlayer insulating film 7, and the drain electrode 6b is electrically connected to the heavily doped drain region 1e through a contact hole 8 formed in the interlayer insulating film 4 and the gate insulating film 2. An alignment layer 16 made of a polyimide film is formed on a surface of the pixel electrode 9a.

Also, a capacitance line 3b formed in the same layer as the scanning line 3a faces, as a top electrode, an extension part 1f (a bottom electrode) extended from the heavily doped drain region 1e through an insulating film (a dielectric film) formed simultaneously with the gate insulating film 2, thereby including a storage capacitor 70.

In the TFT array substrate 10 and the counter substrate 20 having such structure, the pixel electrode 9a and the counter electrode 21 are arranged to face each other. Furthermore, liquid crystal 50 is injected into a space surrounded by the seal material 53 (refer to FIGS. 10 and 11) and these substrates as an electro-optical material, and the space is sealed. When an electric field from the pixel electrode 9a is not applied to the liquid crystal 50, the liquid crystal 50 is in a predetermined alignment state due to an alignment layer. The liquid crystal 50 is made of, for example, a kind of nematic liquid crystal or a mixture of various kinds of nematic liquid crystal.

In a light-incident surface or a light-output side of the counter substrate 20 and the TFT array substrate 10, a polarizing film, a retardation film, a polarizing plate, and others are arranged in a predetermined direction to meet a kind of the liquid crystal 50, that is, an operation mode, such as a TN (twisted nematic) mode, a STN (super TN) mode, or a normally white mode/a normally black mode.

Structure of Peripheral Circuit

In FIG. 10, in an electro-optical device 100 according to the present exemplary embodiment, a data-line driving circuit 101 and scanning-line driving circuits 104 are formed in a peripheral region of an image display region 10a of the surface of the TFT array substrate 10. Basically, the data-line driving circuit 101 and the canning-line driving circuit 104 are composed of an N-channel TFT and a P-channel TFT shown in FIGS. 15 and 16.

Figure 15:
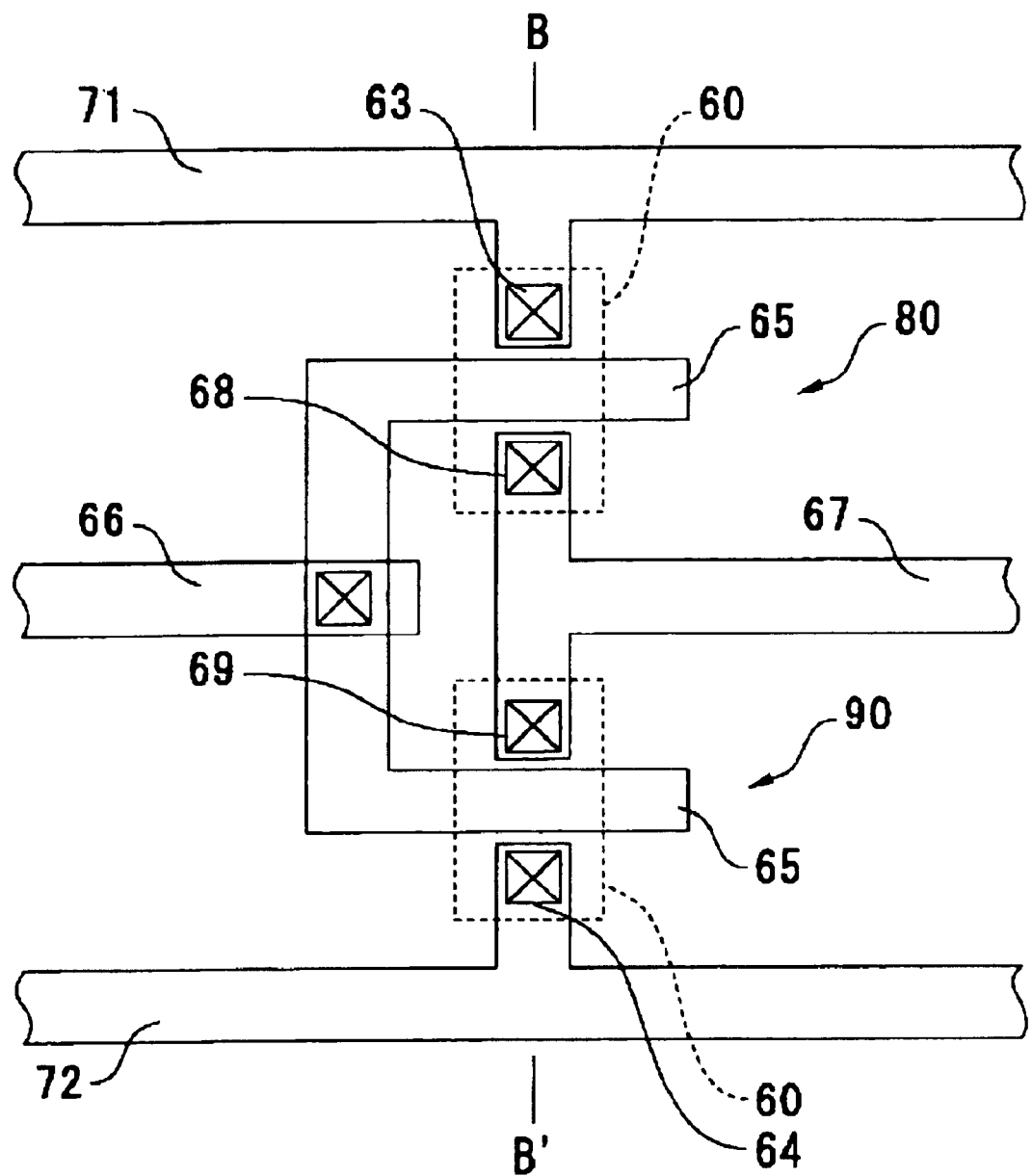
FIG. 15 is a plan view of a circuit formed in a peripheral region of the image display region of the electro-optical device shown in FIGS. 10 and 11.
Figure 16:
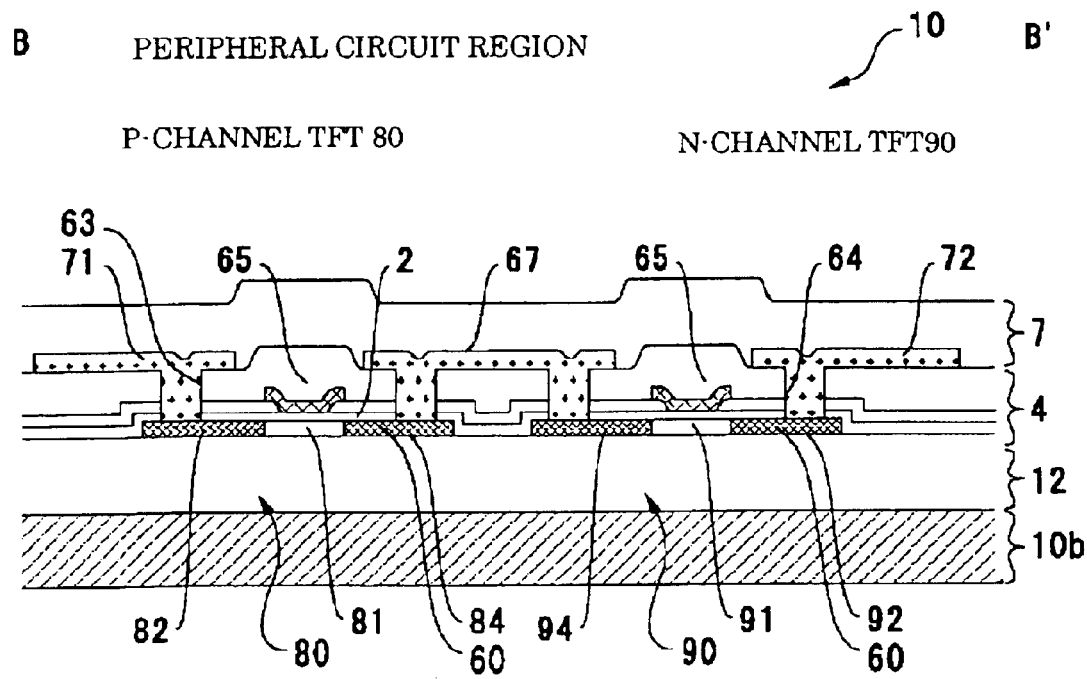
FIG. 16 is a sectional view of a TFT for a driving circuit shown in FIG. 15.

FIG. 15 is a plan view illustrating the structure of a TFT including the peripheral circuit of scanning-line driving circuit 104, the data-line driving circuit 101 and so on. FIG. 16 is a sectional view illustrating the structure of the TFT constituting such a peripheral circuit taken along the plane B–B' shown in FIG. 11.

In FIGS. 15 and 16, the TFT constituting the peripheral circuit is constructed as a complementary TFT composed of a P-channel TFT 80 and an N-channel TFT 90. A semiconductor film 60 (shown in a dotted line) constituting TFTs 80 and 90 for driving circuits is formed in the form of island on a base passivation 12 formed on the substrate 10b.

In the TFTs 80 and 90, a high voltage line 71 and a low voltage line 72 are electrically connected through contact holes 63 and 64 to a source region of the semiconductor film 60, respectively. Also, an input wiring line 66 is connected to a common gate electrode 65, and an output wiring line 67 is electrically connected through contact holes 68 and 69 to a drain region of the semiconductor film 60.

Since the peripheral circuit is also formed by the same process performed in the image display region 10a, the interlayer insulating films 4 and 7 and a gate insulating film 2 are formed in the peripheral circuit region.

Similarly to the pixel-switching TFT 30, heavily doped source regions 82 and 92, and heavily doped drain regions 84 and 94 are formed at both sides of the channel formation region of the TFTs 80 and 90 for a driving circuit. Herein, although the heavily doped source regions 82 and 92, and the heavily doped drain regions 84 and 94 are formed relative to the gate electrode 65 in the self-aligned method, the TFTs 80 and 90 have the structure explained with reference to FIG. 1(A), and a gate insulating film 2 located on one end of the drain is thick. Thus, the intensity of an electric field in the end of the drain is declines, so that the level of OFF leakage current can be low, and the sudden rise of the current level can be reduced or prevented. Furthermore, since the gate insulating film 2 located on center parts of the channel formation regions 81 and 91 is thin and there is no low-concentration region on contrary to the LDD structure, the level of ON current is high.

Furthermore, in FIG. 16, TFTs having a structure explained with reference to FIG. 1(A) is shown as TFTs 80 and 90. However, it is not limited to that shown in FIG. 1(A), but TFTs having structures shown in FIGS. 1(B) to 1(D), FIGS. 5(A) to 5(D), and FIGS. 6(A) to 6(B) may be used as TFTs 80 and 90.

Other Applications

Regarding to the aforementioned exemplary embodiments, although the TFT array substrate is explained as a semiconductor device used for an active-matrix-type electro-optical device, the present invention may be applied to a TFT array substrate used for an electro-optical device using an electro-optical material except for liquid crystal, for example, an organic electroluminescence display device explained with reference to FIGS. 17 and 18, or to a method of manufacturing a semiconductor device except for an electro-optical device.

Figure 17:
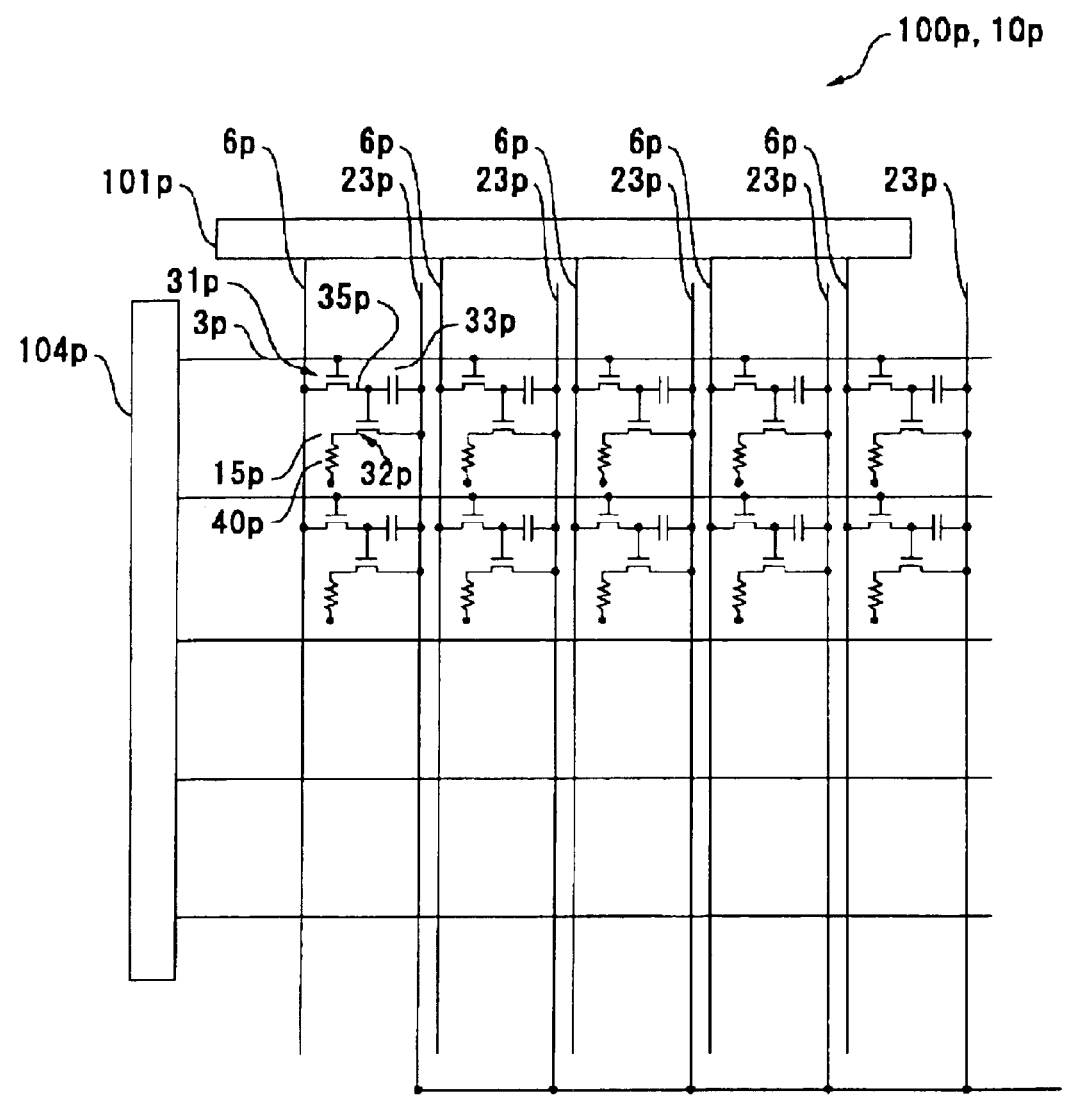
FIG. 17 is a block schematic of an active-matrix-type electro-optical device using a charge-injecting-type organic thin film electroluminescence element.
Figure 18A:
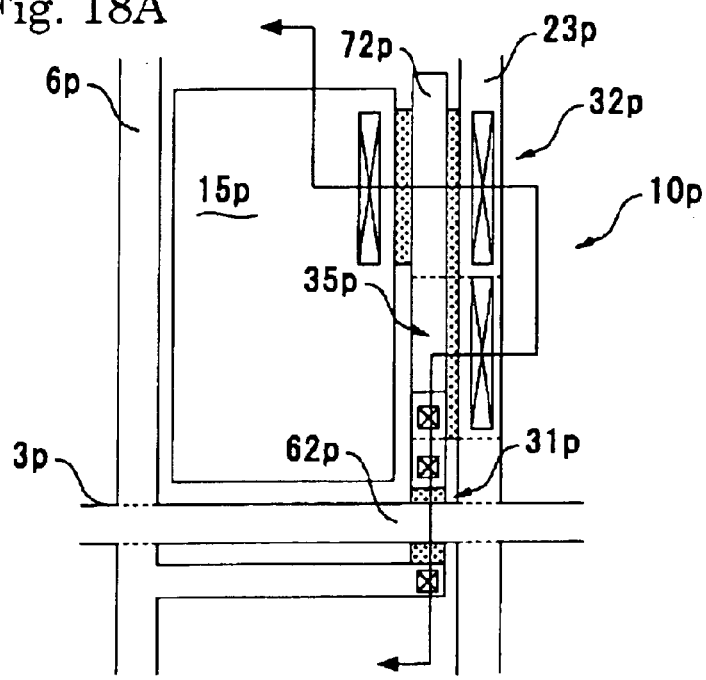
FIGS. 18(A) and (B) are an enlarged plan view and an enlarged sectional view, respectively, illustrating a pixel region formed in the electro-optical device shown in FIG. 17.
Figure 18B:
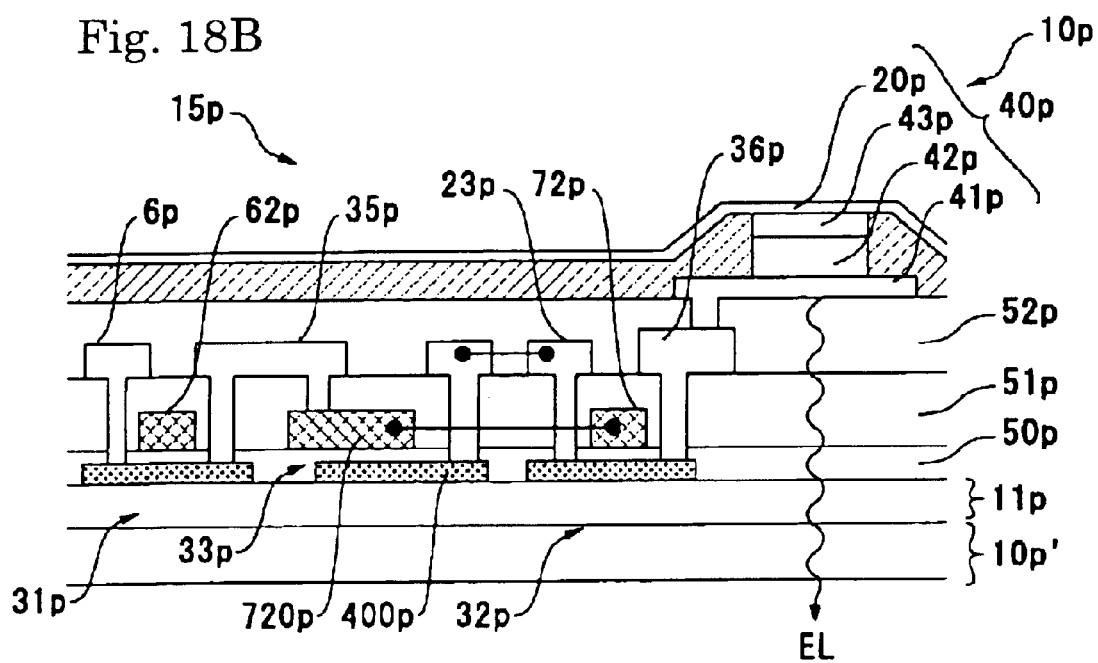

FIG. 17 is a block schematic of an active-matrix-type electro-optical device using charge-injecting-type organic thin film electroluminescence elements. FIGS. 18(A) and 18(B) are an enlarged plan view and an enlarged sectional view, respectively, illustrating a pixel region formed in the electro-optical device shown in FIG. 17.

An electro-optical device 100p shown in FIG. 17 is an active-matrix-type display device in which a light-emitting element, such as an EL (electroluminescence) element emitting light by a drive current flowed through an organic semiconductor film or an LED (light-emitting diode) element, is driven by a TFT. Since all of light-emitting elements, used in the electro-optical device of this type, are self-light-emitting elements, it is an advantage that backlight is not required and dependency on viewing angle is low.

In the electro-optical device 100p described in the present specification, a plurality of scanning lines 3p, a plurality of data lines 6p provided to intersect the extended-provided direction of the plurality of the scanning lines 3p, a plurality of common feeder lines 23p parallel to the data lines 6p, and pixel regions 15p corresponding to intersection points of the data lines 6p and the scanning lines 3p are provided on the TFT array substrate 10p. The data lines 6p are provided to a data-side driving circuit 101p including a shift register, a level shifter, a video line, and an analog switch. The scanning lines 3b are provided to a scanning-side driving circuit 104p including a shift register and a level shifter.

Each pixel region 15p also includes a first TFT 31p (a semiconductor element) where scanning signals are supplied through the scanning line 3p to a gate electrode thereof, a holding capacitor 33p (a thin film capacitor element) holding image signals supplied from the data line 6p through the first TFT 31p, a second TFT 32p (a semiconductor element) where the image signals held by the holding capacitor 33p are supplied to a gate electrode thereof, and a light-emitting element 40p to which a driving current is flowed from the common feeder line 23p when connecting to the common feeder line 23p through the second TFT 32p.

According to the present exemplary embodiment, as shown in FIGS. 18(A) and (B), in each pixel region 15p, a base passivation 11p is also formed on a surface of a substrate 10p' made of glass and the like, and the first TFT 31p and the second TFT 32p are formed using two semiconductor films provided on the surface of the base protection film 11p in the shape of island. Furthermore, a relay electrode 36p is electrically connected to either a source region or a drain region of the second TFT 32p, and a pixel electrode 41p is electrically connected to the relay electrode 36p. A hole-injection layer 42p, an organic semiconductor film 43p as an organic electroluminescent material layer, and a counter electrode 20p formed of a metal film made of aluminum containing lithium, calcium, etc. are deposited on the upper side of the pixel electrode 41p. Herein, the counter electrode 20p is formed over the pixel regions 15p striding the data line 6p.

The common feeder line 23p is electrically connected to another side of the source region and drain region of the second TFT 32p through the contact hole. In contrast, a voltage holding electrode 35p is electrically connected to one side of the source region and drain region of the first TFT 31p and is electrically connected to an extension 720p of the second gate electrode 72p. The bottom side of the extension 720p faces the semiconductor film 400p through an upper-layer gate insulating film 50p, and the semiconductor film 400p is conductive because of an injected impurity thereto. Thus, the semiconductor film 400p constitutes a holding capacitor 33p together with the extension 720p and the upper-layer gate insulating film 50p. Herein, the common feeder line 23p is electrically connected to the semiconductor film 400p through a contact hole of an interlayer insulating film 51p.

Thus, since the holding capacitor 33p holds an image signal supplied from the data line 6p through the first TFT 31p, the gate electrode 72p of the second TFT 32p is held at a level corresponding to the image signal even if the first TFT 31p is OFF. Thus, a driving current from the common feeder line 23p flows continuously to the light-emitting element 40p, so that the light-emitting element emits continuously light to display images.

In the TFT array substrate 10p, if the structure explained with reference to FIGS. 1 to 9 is applied to the first TFT 31p and the second TFT 32p, it is possible to enhance electrical characteristic and reliability.

Application to Electronic Apparatus

Next, an example of an electronic apparatus having electro-optical devices 100 and 100p to which the present invention is applied will be described with reference to FIGS. 19, 20(A), and 20(B).

Figure 19:
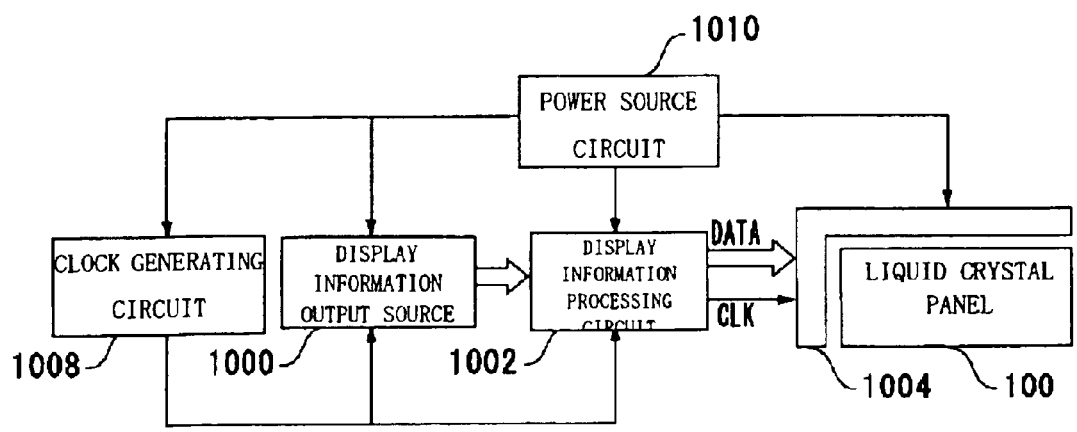
FIG. 19 is a block schematic illustrating a circuit of an electronic apparatus using the electro-optical device according to the present invention as a display element.

FIG. 19 is a schematic illustrating a structure of an electronic apparatus having the electro-optical device 100 having the same structure as the aforementioned electro-optical device. FIGS. 20(A) and 20(B) are schematics illustrating a mobile personal computer and a cellular phone, as an example of an electronic apparatus using the electro-optical device according to the present invention, respectively.

In FIG. 19, an electronic apparatus includes a display information output source 1000, a display information processing circuit 1002, a driving circuit 1004, electro-optical devices 100 and 100p, a clock generating circuit 1008, and a power source circuit 1010. The display information output source 1000 includes a memory, such as ROM (Read Only Memory), RAM (Random Access Memory), and an Optical disc, and a tuning circuit for tuning and outputting a video signal of a television signal. Furthermore, the display information output source 1000 processes a predetermined format image signal based on a clock from the clock generating circuit 1008 and outputs it to the display information processing circuit 1002. The display information processing circuit 1002 includes well-known various circuits such as an amplification/phase reversion circuit, a phase developing circuit, a rotation circuit, a gamma compensation circuit, or a clamp circuit. Furthermore, the display information processing circuit 1002 generates in turn a digital signal from input display information based on a clock signal and outputs it to the driving circuit 1004 together with the clock signal CLK. The driving circuit 1004 drives the electro-optical devices 100 and 100p. The power source circuit 1010 supplies a predetermined power to the respective circuits. Moreover, the driving circuit 1004 may be formed on the TFT array substrate constituting the electro-optical devices 100 and 100p, and the display information processing circuit 1002 may also be formed on the TFT array substrate.

An electronic apparatus having such structure includes, for example, a projection-type liquid crystal display device (a liquid crystal projector), a personal computer (PC) for multimedia, an engineering workstation (EWS), a pager or a cellular phone, a word processor, a television, a view-finder-type or monitor-direct-vision-type video tape recorder, an electronic organizer, an electronic desktop calculator, a car navigation apparatus, a POS terminal, a touch panel, and the like.

Figure 20A:
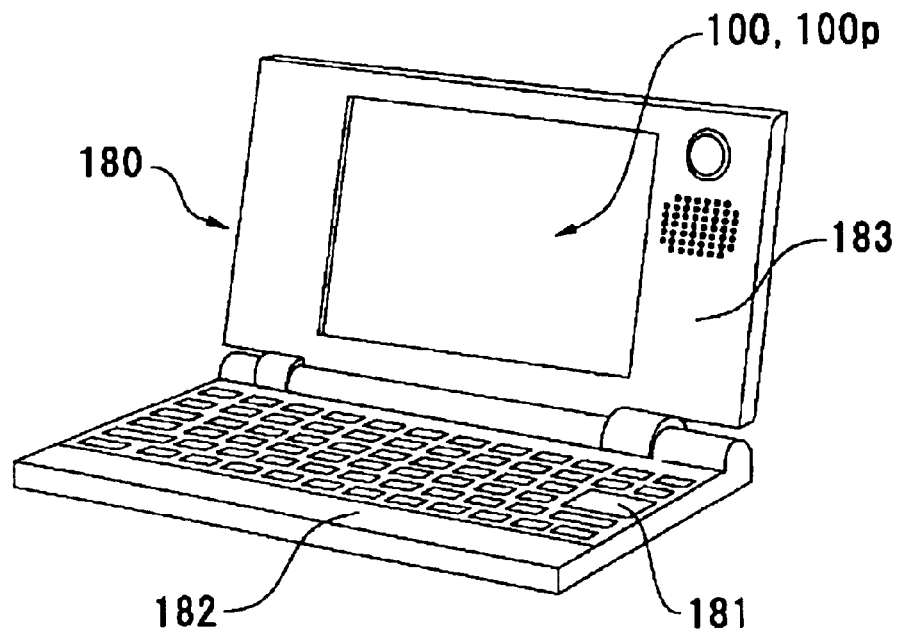
FIGS. 20(A) and (B) are schematics illustrating a mobile personal computer and a cellular phone, respectively, as an exemplary embodiment of an electronic apparatus using the electro-optical device according to the present invention.

As shown in FIG. 20(A), the personal computer 180 includes a body 182 having a keyboard 181, and a display unit 183. The display unit 183 includes the aforementioned electro-optical devices 100 and 100p.

Figure 20B:
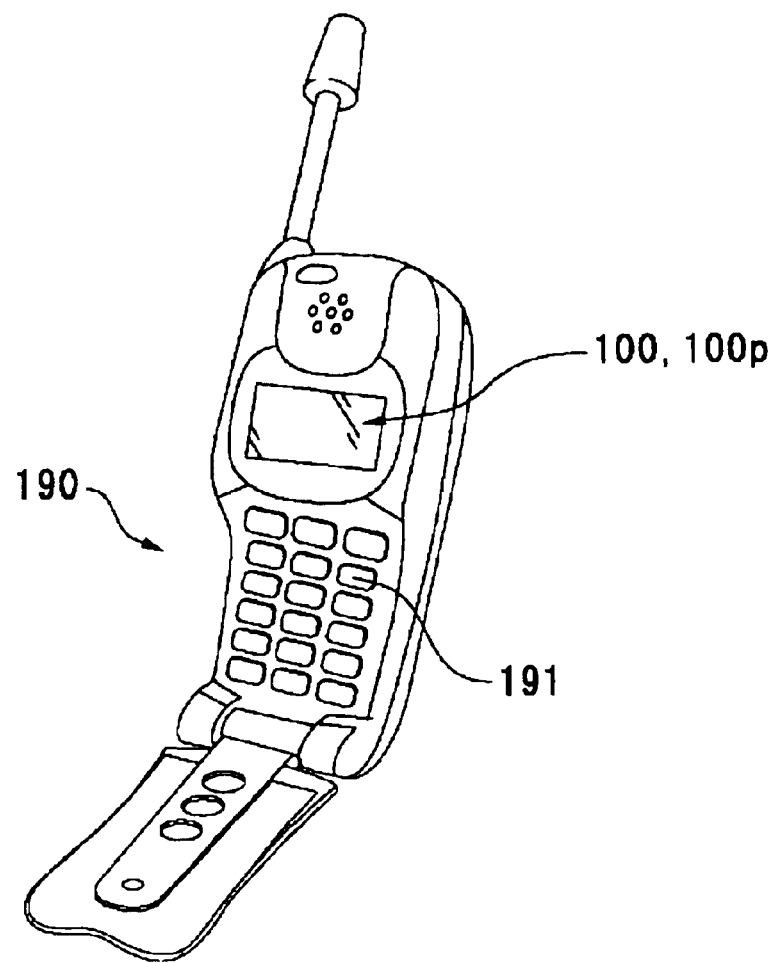
Figure 21A:
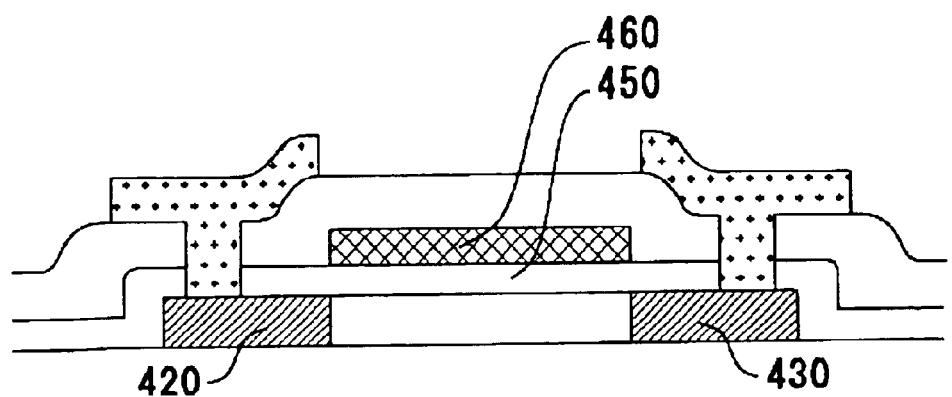
FIGS. 21(A) and (B) are a sectional view of a related art self-aligned-structure TFT and a sectional view of a related art LDD-structure TFT, respectively.
Figure 21B:
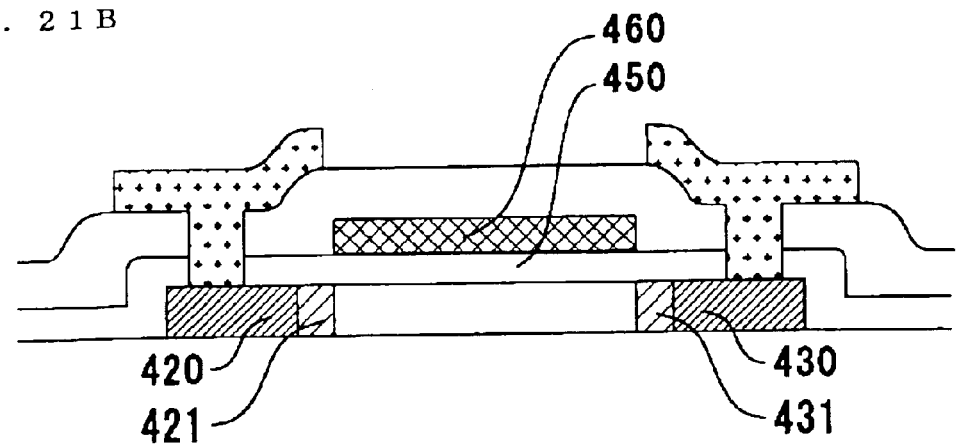

As shown in FIG. 20(B), the cellular phone 190 also includes a plurality of operation buttons 191 and a display part including the above-described electro-optical devices 100 and 100p.

Advantages

As described above, since in the transistor to which the present invention is applied, the gate insulating film facing the end of the drain is thick, the intensity of electric field in the end of the drain declines. Thus, the level of OFF leakage current can be low, and the sudden rise of the current level can be reduced or prevented. Also, since the gate insulating film facing the center part of the channel formation region is thin and there is no low-density region on contrary to the LDD structure, the level of ON current is high. Thus, according to the present invention, it is possible to enhance both ON current characteristics and OFF leakage current characteristics.

What is claimed is:

1. A semiconductor device, comprising:

a substrate;

transistors formed on the substrate, each of the transistors including a channel formation region to form a channel between a source region and a drain region; and a gate electrode facing the channel formation region with a gate insulating film interposed therebetween, the gate insulating film including a first layer and a second layer provided on the first layer, at least a part of the gate insulating film overlapping with a boundary region of the channel formation region adjacent to the drain region, including both of the first and second layers and being thicker than a part of the gate insulating film overlapping with a center part of the channel formation region, relative to a longitudinal direction of the channel, which includes either of the first or the second layer.

2. The semiconductor device according to claim 1, a part of the gate insulating film overlapping with a boundary region of the channel formation region adjacent to the source region, including both of the first and second layers and being thicker than the part of the gate insulating film overlapping with the center part of the channel formation region, relative to the longitudinal direction of the channel, which includes either of the first or the second layer.

3. The semiconductor device according to claim 1, each of the source region and the drain region having a lightly doped region or an offset region facing the gate electrode with the gate insulating film interposed therebetween; and at least a part of the gate insulating film overlapping with a boundary region of the channel formation region adjacent to the lightly doped region or the offset region of the drain region, including both of the first and second layers and being thicker than the part of the gate insulating film overlapping with the center part of the channel formation region, relative to the longitudinal direction of the channel, which includes either of the first or the second layer.

4. The semiconductor device according to claim 3, a part of the gate insulating film overlapping with a boundary region of the channel formation region adjacent to the lightly doped region or the offset region of the source region, including both of the first and second layers and being thicker than the part of the gate insulating film overlapping with the center part of the channel formation region, relative to the longitudinal direction of the channel, which includes either of the first or the second layer.

5. The semiconductor device according to claim 1, the channel formation region, the source region, and the drain region being formed on a semiconductor film formed on a surface of the substrate.

6. The semiconductor device according to claim 1, the substrate being a semiconductor substrate, and the channel formation region, the source region, and the drain region being formed on the semiconductor substrate.

7. An electro-optical device including the semiconductor device, according to claim 1 as a substrate for an electro-optical device holding an electro-optical material, pixels, each including a pixel switching transistor and a pixel electrode, being formed on the substrate for the electro-optical device in a matrix.

8. The electro-optical device according to claim 7, the electro-optical material being liquid crystal held between the substrate for the electro-optical device and a counter substrate.

9. The electro-optical device according to claim 7, the electro-optical material being an organic electroluminescent material constituting a light-emitting device on the substrate for the electro-optical device.

10. The semiconductor device according to claim 1, the part of the gate insulating film overlapping with the center part of the channel formation region including the second layer without including the first layer.

11. The semiconductor device according to claim 1, the first layer being one of a silicon oxide film and a silicon nitride film, the second layer being the other of the silicon oxide film and the silicon nitride film.

* * * * *